(12) United States Patent
Lee

(10) Patent No.: US 11,610,961 B2
(45) Date of Patent: Mar. 21, 2023

(54) DISPLAY DEVICE HAVING A FLAT PLATE-SHAPED PIXEL ELECTRODE FOR IMPROVING CONTRAST AND METHOD OF MANUFACTURING DISPLAY DEVICE

(71) Applicant: Samsung Display Co., LTD., Yongin-si (KR)

(72) Inventor: Hyeon Bum Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 173 days.

(21) Appl. No.: 17/092,811

(22) Filed: Nov. 9, 2020

(65) Prior Publication Data

US 2021/0327994 A1 Oct. 21, 2021

(30) Foreign Application Priority Data

Apr. 16, 2020 (KR) .................. 10-2020-0046069

(51) Int. Cl.
*H01L 27/32* (2006.01)
*H01L 51/56* (2006.01)

(52) U.S. Cl.
CPC .......... *H01L 27/3276* (2013.01); *H01L 51/56* (2013.01); *H01L 2227/323* (2013.01)

(58) Field of Classification Search
CPC ............... H01L 27/3248; H01L 27/326; H01L 27/3276; H01L 2227/323; H01L 51/5281; H01L 51/56
USPC ........................................................ 257/40
See application file for complete search history.

(56) References Cited

U.S. PATENT DOCUMENTS

| 2005/0168135 A1* | 8/2005 | Iga ....................... H01L 51/5271 |
| | | 313/500 |
| 2010/0156860 A1* | 6/2010 | Yamamoto ............... G09G 3/30 |
| | | 345/205 |
| 2015/0311227 A1* | 10/2015 | Moriwaki ............. H01L 27/124 |
| | | 257/43 |
| 2016/0372534 A1* | 12/2016 | Lee ..................... H01L 27/3248 |

FOREIGN PATENT DOCUMENTS

| KR | 10-1116825 | 2/2012 |
| KR | 10-2016-0089940 | 7/2016 |
| KR | 10-2018-0045968 | 5/2018 |
| KR | 10-2019-0104091 | 9/2019 |

* cited by examiner

*Primary Examiner* — Matthew E. Gordon
(74) *Attorney, Agent, or Firm* — Kile Park Reed & Houtteman PLLC

(57) ABSTRACT

A display device includes a transistor disposed on a substrate and including a gate electrode, a channel region, a source region, and a drain region; a first insulating layer disposed on the transistor; a drain electrode that electrically contacts the drain region through an opening formed in the first insulating layer; a connection electrode disposed on the drain electrode and electrically contacting the drain electrode; a second insulating layer disposed on the first insulating layer, an upper surface of the second insulating layer and an upper surface of the connection electrode forming a flat surface that is parallel to the substrate; a pixel electrode disposed on the flat surface and electrically contacting an upper surface of the connection electrode; an emission layer disposed on the pixel electrode; and a common electrode disposed on the emission layer.

20 Claims, 24 Drawing Sheets

DISPLAY DEVICE HAVING A FLAT PLATE-SHAPED PIXEL ELECTRODE FOR IMPROVING CONTRAST AND METHOD OF MANUFACTURING DISPLAY DEVICE

CROSS-REFERENCE TO RELATED APPLICATION(S)

This application claims priority to and benefits of Korean Patent Application No. 10-2020-0046069, filed in the Korean Intellectual Property Office on Apr. 16, 2020, the entire contents of which are incorporated herein by reference.

BACKGROUND

1. Technical Field

Embodiments of the present invention relates to a display device and a manufacturing method of a display device.

2. Description of the Related Art

An organic light emitting diode display generally includes two electrodes and a light emitting layer disposed therebetween, and electrons injected from one of the two electrodes and holes injected from the other electrode are combined in the light emitting layer to form excitons. Excitons output energy and emit light while changing from an excited state to a ground state.

The organic light emitting diode display generally includes pixels including an organic light emitting diode that is a self-emission element, and transistors and capacitors are formed in each pixel to drive the organic light emitting diode. The transistors include a switching transistor and a driving transistor. The organic light emitting diode display resonates and emits the generated light, and contrast may be reduced by reflection of external light from transistors, capacitors, signal lines connected thereto, and the like.

A method of adhering a polarization film to an organic light emitting diode display may be provided to improve contrast. The polarization film includes a linear polarization film and a retardation film. A thickness of the polarization film is approximately 200 μm, making it difficult to slim the organic light emitting diode display and increasing production cost.

The above information disclosed in this Background section is only for enhancement of understanding of the background of the invention, and therefore it may contain information that does not form the prior art that is already known in this country to a person of ordinary skill in the art.

SUMMARY

As a method of improving the contrast of an organic light emitting diode display without using a polarization film, there is provided a method of reducing reflection of external light by forming a light blocking portion and a color filter as an encapsulation layer of the organic light emitting diode display. The light blocking portion includes openings corresponding to the pixels, and the color filter is disposed to overlap the openings. Such an organic light emitting diode display may be slimmed because there is no need to use a polarization film.

The organic light emitting diode includes a pixel electrode, an emission layer, and a common electrode. The pixel electrode may electrically contact a transistor through an opening formed in an insulating layer. A portion of the pixel electrode is formed in the opening to electrically contact the transistor disposed under the insulating layer. Light generated in the emission layer may be diffusely reflected by the portion of the pixel electrode formed in the opening, and reflective color bands such as green and magenta may be generated around the openings by diffuse reflection. These reflective color bands may increase pixel color differences and may deteriorate display quality.

In an exemplary embodiment of the present invention, a display device may include a transistor disposed on a substrate and including a gate electrode, a channel region, a source region and a drain region; a first insulating layer disposed on the transistor; a drain electrode that electrically contacts the drain region through an opening formed in the first insulating layer; a connection electrode disposed on the drain electrode and electrically contacting the drain electrode; a second insulating layer disposed on the first insulating layer, an upper surface of the second insulating layer and an upper surface of the connection electrode forming a flat surface that is parallel to the substrate; a pixel electrode disposed on the flat surface and electrically contacting an upper surface of the connection electrode; an emission layer disposed on the pixel electrode; and a common electrode disposed on the emission layer.

The pixel electrode may have a plate shape that is parallel to the substrate.

The pixel electrode may have a plate shape that does not include a protrusion that is not parallel to the substrate.

The upper surface of the second insulating layer may horizontally coincide with the upper surface of the connection electrode.

A thickness of the second insulating layer may be equal to a sum of a thickness of a portion of the drain electrode, disposed on the first insulating layer, and a thickness of the connection electrode.

The display device may further include a conductive pattern disposed between the first insulating layer and the second insulating layer; and a third insulating layer disposed between the first insulating layer and the second insulating layer and contacting a side surface of the conductive pattern without covering the conductive pattern.

The third insulating layer may be spaced apart from the drain electrode in a horizontal direction.

A thickness of the third insulating layer may be equal to a thickness of the conductive pattern.

The second insulating layer may comprise a first portion having a first thickness and a second portion having a second thickness, and the first thickness of the first portion of the second insulating layer may be equal to the thickness of the connection electrode.

The display device may further include a third insulating layer disposed between the first insulating layer and the second insulating layer and contacting a side surface of the drain electrode without covering the drain electrode.

The third insulating layer may comprise a first portion having a first thickness and a second portion having a second thickness, and the first thickness of the third insulating layer may be equal to a thickness of a portion of the drain electrode, disposed on the first insulating layer.

The display device may further include a data line disposed between the second insulating layer and the third insulating layer and transferring a data signal; and a conductor disposed between the first insulating layer and the third insulating layer and overlapping the data line. The second thickness of the second portion of the third insulating layer in a portion overlapping the data line may be greater than the first thickness of the third insulating layer.

The second thickness of the second portion of the second insulating layer in a portion overlapping the data line may be smaller than the first thickness of the third insulating layer.

In an exemplary embodiment of the present invention, a manufacturing method of a display device may include forming a transistor including a gate electrode, a channel region, a source region, and a drain region on the substrate; forming a first insulating layer including an opening on the transistor; forming a drain electrode on the first insulating layer to electrically contact the drain region through the opening; forming a connection electrode on the drain electrode to electrically contact the drain electrode; forming a second insulating layer on the first insulating layer; forming an upper surface of the second insulating layer and an upper surface of the connection electrode to form a flat surface that is parallel to the substrate; forming a pixel electrode on the flat surface to electrically contact an upper surface of the connection electrode; forming an emission layer on the pixel electrode; and forming a common electrode on the emission layer.

The forming of the pixel electrode may comprise forming the pixel electrode to have a plate shape that is parallel the substrate and that does not include a protrusion that is not parallel to the substrate.

The forming of the upper surface of the second insulating layer and the upper surface of the connection electrode may comprise forming the upper surface of the second insulating layer and the upper surface of the connection electrode to horizontally coincide with each other.

A thickness of the second insulating layer may be equal to a sum of a thickness of a portion of the drain electrode, disposed on the first insulating layer, and a thickness of the connection electrode.

The manufacturing method may further include forming a conductive pattern on the first insulating layer; and forming a third insulating layer on the first insulating layer to contact a side surface of the conductive pattern and not to cover the conductive pattern, and forming the third insulating layer to have a thickness equal to a thickness of the conductive pattern.

The forming of the second insulating layer may comprise forming the second insulating layer to include a first portion having a first thickness and a second portion having a second thickness. The first thickness of the second insulating layer may be equal to a thickness of the connection electrode.

The manufacturing method may further include forming a third insulating layer on the first insulating layer to contact a side surface of the drain electrode and not to cover the drain electrode; and forming the third insulating layer to include a first portion having a first thickness and a second portion having a second thickness. The first thickness of the first portion of the third insulating layer may be equal to a thickness of a portion of the drain electrode, disposed on the first insulating layer.

According to the exemplary embodiment, it is possible to reduce reflective color bands that may occur around at least one opening by forming the pixel electrode in a plate shape that is parallel to the substrate.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
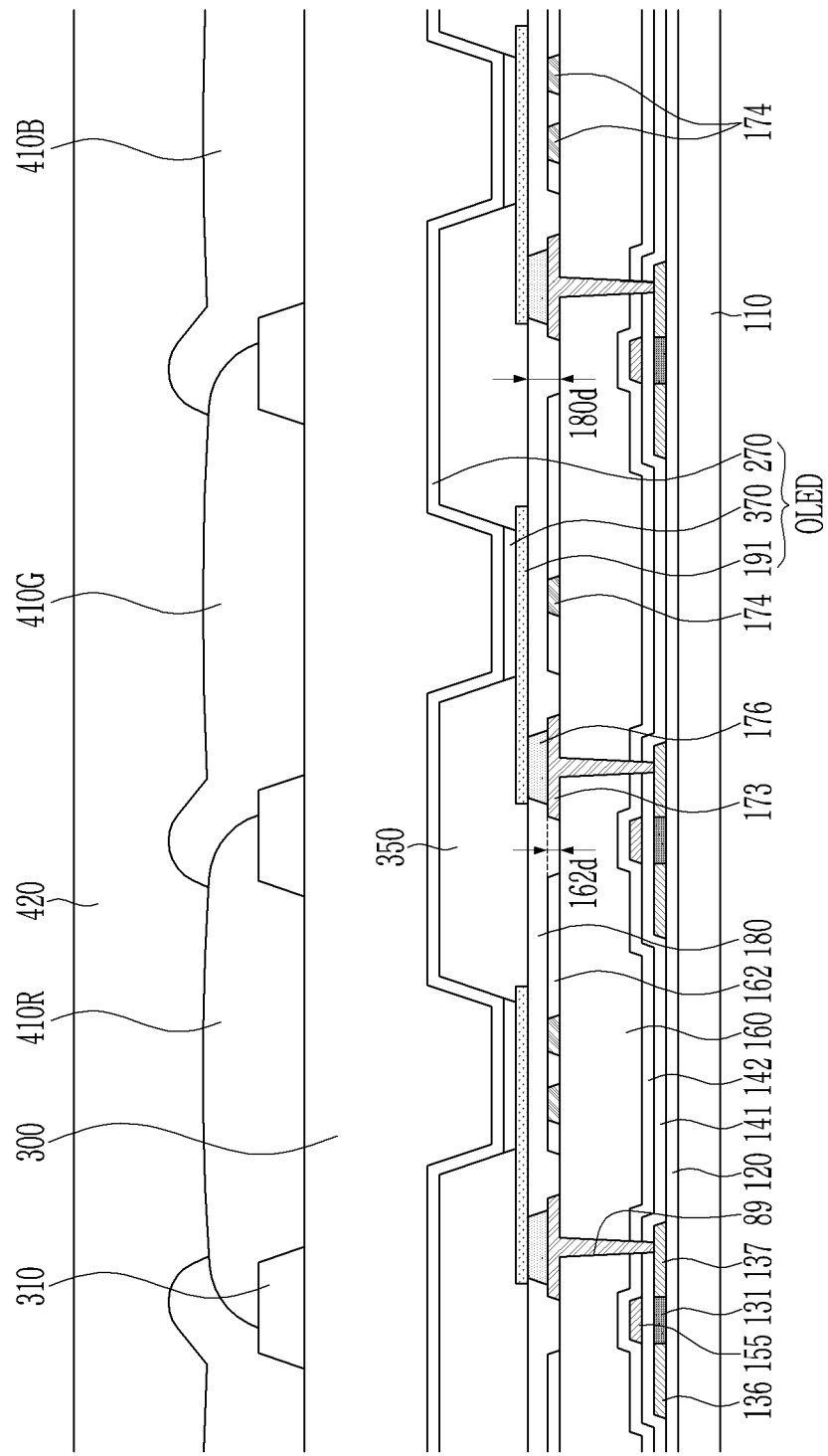
FIG. 1 illustrates schematic cross-sectional view showing a display device according to an exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various ways without departing from the spirit or scope of the present invention.

In the various exemplary embodiments, the same reference numerals may denote the same elements, and descriptions of elements discussed with respect to an exemplary embodiment may not be repeated in descriptions with respect to other exemplary embodiments.

To clearly describe the present invention, parts that are irrelevant to or implied in the description may be omitted, and like numerals may refer to like or similar elements throughout the specification.

Since sizes and thicknesses of elements shown in the accompanying drawings are arbitrarily given for better understanding and ease of description, the present invention is not limited to the illustrated sizes and thicknesses. In the drawings, the thicknesses of layers, films, panels, regions, etc., may be exaggerated for clarity. In the drawings, for better understanding and ease of description, the thicknesses of some layers and areas may be exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the term "on" or "above" means being disposed (or positioned) on or below the object portion and does not necessarily mean being disposed (or positioned) on the upper side of the object portion based on a gravitational direction.

Throughout the specification, unless explicitly described to the contrary, the term "comprise" and variations such as "comprises" or "comprising" will be understood to imply the inclusion of stated elements but not the exclusion of any other elements.

In the specification, the phrase "in a plan view" means when an object portion is viewed from above, and the phrase "in a cross-sectional view" means when a cross-section taken by vertically cutting an object portion is viewed from a side.

Hereinafter, a display device according to an exemplary embodiment of the present invention will be described with reference to FIG. 1.

FIG. 1 illustrates a schematic cross-sectional view showing a display device according to an exemplary embodiment of the present invention.

The display device may include a display area displaying an image and a non-display area (or a peripheral area) positioned around adjacent to the display area. The display area includes pixels. The display area corresponds to a screen on which the image is displayed. Circuits and/or signal lines for generating and/or transferring various signals are positioned in the peripheral area. The peripheral area may surround the display area. FIG. 1 illustrates a schematic stacked structure of the display device in the display area.

Referring to FIG. 1, the display device includes a substrate 110, transistors disposed on the substrate 110, an organic light emitting diode OLED, and an encapsulation layer.

The substrate 110 may include an inorganic or organic insulating material such as glass and plastic. The substrate 110 may have various degrees of flexibility.

A first insulating layer 120 is disposed on the substrate 110. The first insulating layer 120 may block impurities that may diffuse from the substrate 110 to a semiconductor layer and may reduce stress applied to the substrate 110 in a process of forming the semiconductor layer. The first insulating layer 120 may include an inorganic insulating material such as a silicon oxide and a silicon nitride.

A semiconductor layer is disposed on the first insulating layer 120. The semiconductor layer may include a channel region 131 overlapping a gate electrode 155, and a source region 136 and a drain region 137 that are doped at opposite side of the channel region 131. The semiconductor layer may include polysilicon, amorphous silicon, or an oxide semiconductor.

A second insulating layer 141 is disposed on the semiconductor layer. The second insulating layer 141 may include an inorganic insulating material. The second insulating layer 141 may be referred to as a gate insulating layer.

A gate conductive layer including the gate electrode 155 is disposed on the second insulating layer 141. Although not illustrated, the gate conductive layer may include scan lines, control lines, and the like. The gate conductive layer may include a metal such as molybdenum (Mo), copper (Cu), aluminum (Al), silver (Ag), chromium (Cr), tantalum (Ta), titanium (Ti), or an alloy thereof. The channel region 131, the source region 136, and the drain region 137 of the semiconductor layer may form (or constitute) one transistor with the gate electrode 155.

A third insulating layer 142 is disposed on the second insulating layer 141 and the gate conductive layer. The third insulating layer 142 may include an inorganic insulating material.

A fourth insulating layer 160 is disposed on the third insulating layer 142. The fourth insulating layer 160 may include an inorganic insulating material or an organic insulating material. Although not illustrated, a storage conductive layer including a storage electrode line, an initialization voltage line, and the like may be disposed between the third insulation layer 142 and the fourth insulation layer 160. The fourth insulating layer 160 may be referred to as an interlayer insulating layer.

A first data conductive layer is disposed on the fourth insulating layer 160. The first data conductive layer may include a drain electrode 173 and a conductive pattern 174. The drain electrode 173 may electrically contact the drain region 137 of the semiconductor layer through an opening (or a contact opening) 89 formed in the second insulating layer 141, the third insulating layer 142, and the fourth insulating layer 160. Although not illustrated, the first data conductive layer may include a source electrode electrically connected to the source region 136 of the semiconductor layer. The source electrode may be electrically connected to the source region 136 of the semiconductor layer through another opening (or contact opening) formed in the second insulating layer 141, the third insulating layer 142, and the fourth insulating layer 160. A conductive pattern 174 may be a portion of a pixel circuit. The conductive pattern 174 may include a data line for transferring a data signal, a driving voltage line for transferring a driving voltage, and the like.

A fifth insulating layer 162 is disposed on the fourth insulating layer 160. The fifth insulating layer 162 may be disposed on the fourth insulating layer 160 so as not to cover the first data conductive layer. The fifth insulating layer 162 may include an organic insulating material such as a polyimide, an acryl-based polymer, or a siloxane-based polymer. The fifth insulating layer 162 may be spaced apart from the drain electrode 173 in a horizontal direction and may be physically separated from the drain electrode 173. For example, the fifth insulating layer 162 may be formed to expose the drain electrode 173 without covering the drain electrode 173. The fifth insulating layer 162 may not cover the conductive pattern 174, and a side surface of the fifth insulating layer 162 may contact a side surface of the conductive pattern 174. A thickness 162d of the fifth insulating layer 162 may be equal to a thickness of a portion of the first data conductive layer, disposed on the fourth insulating layer 160. For example, a thickness 162d of the fifth insulating layer 162 may be equal to that of a portion of the drain electrode 173, disposed on the fourth insulating layer 160. The thickness 162d of the fifth insulating layer 162 may be equal to that of a portion of the source electrode, disposed on the fourth insulating layer 160. The thickness 162d of the fifth insulating layer 162 may be equal to that of the conductive pattern 174 disposed on the fourth insulating layer 160. For example, in case that the first data conductive layer has a thickness of about 0.8 µm on the fourth insulation layer 160, the thickness 162d of the fifth insulation layer 162 may be formed to be about 0.8 µm.

A connection electrode 176 may be disposed on the drain electrode 173. The connection electrode 176 may be stacked to overlap the drain electrode 173. A lower surface of the connection electrode 176 may contact an upper surface of the drain electrode 173. The connection electrode 176 may completely overlap the drain electrode 173.

A sixth insulating layer 180 is disposed on the first data conductive layer and the fifth insulating layer 162. The sixth insulating layer 180 may overlap the first data conductive layer and the fifth insulating layer 162 without covering the connection electrode 176. The sixth insulating layer 180 may include an organic insulating material such as a polyacrylic resin and a polyimide resin. A side surface of the sixth insulating layer 180 may be in contact with a side surface of the connection electrode 176, and an upper surface of the sixth insulating layer 180 and an upper surface of the connection electrode 176 may form a flat surface parallel to the substrate 110. The upper surface of the sixth insulating layer 180 may horizontally coincide with the upper surface of the connection electrode 176. A thickness 180d of the sixth insulating layer 180 may be equal to a sum of a thickness of a portion of the first data conductive layer, disposed on the fourth insulating layer 160, and a thickness of the connection electrode 176.

A pixel electrode 191 is disposed on the connection electrode 176 and the sixth insulating layer 180. The pixel electrode 191 is disposed on the flat surface formed by the connection electrode 176 and the sixth insulating layer 180. Since the pixel electrode 191 is disposed on the flat surface formed by the connection electrode 176 and the sixth insulating layer 180, the pixel electrode 191 may have a plate shape parallel to the substrate 110. For example, the pixel electrode 191 may not include a protrusion that is not parallel to the substrate 110. A lower surface of the pixel electrode 191 may contact the upper surface of the connection electrode 176, and the pixel electrode 191 may be electrically connected to the transistor through the connection electrode 176. The pixel electrode 191 may include a metal such as silver (Ag), nickel (Ni), gold (Au), platinum (Pt), aluminum (Al), copper (Cu), aluminum neodium (AlNd), aluminum nickel lanthanum (AlNiLa), or a metal alloy. As another example, the pixel electrode 191 may include a transparent conductive material such as an indium tin oxide (ITO) or an indium zinc oxide (IZO).

The pixel electrode 191 is formed to have a plate shape that is parallel to the substrate 110, and thus diffuse reflection by the pixel electrode 191 may be reduced, and a reflection color band generated by the diffuse reflection may be reduced.

A seventh insulating layer 350 including openings overlapping the pixel electrode 191 is disposed on the sixth insulating layer 180 and the pixel electrode 191. The openings of the seventh insulating layer 350 may define a pixel area of each of the pixels, and the seventh insulating layer 350 may be referred to as a pixel defining layer. The pixel area may refer to an area occupied by the emission layer 370 of the organic light emitting diode OLED in a plan view. The seventh insulating layer 350 may include an organic insulating material. The seventh insulating layer 350 may include a black color pigment, and transistors and various signal lines disposed below the seventh insulating layer 350 may be prevented from being viewed by a user.

An emission layer 370 is disposed in the pixel electrode 191. The emission layer 370 is disposed in the pixel area defined by the openings of the seventh insulating layer 350.

A common electrode 270 may be disposed on the emission layer 370. The common electrode 270 may cover the entire display area. A common voltage may be applied to the common electrode 270. The common electrode 270 may be made of a low work function metal such as calcium (Ca), barium (Ba), magnesium (Mg), aluminum (Al), and silver (Ag) as a thin layer to have a light transmittance. As another example, the common electrode 270 may include a transparent conductive material such as an indium tin oxide (ITO) or an indium zinc oxide (IZO).

The pixel electrode 191, the emission layer 370, and the common electrode 270 may form an organic light emitting diode OLED of one pixel. The pixel electrode 191 may be an anode of an organic light emitting diode OLED, and the common electrode 270 may be a cathode of an organic light emitting diode OLED. Organic light emitting diodes OLED included in the display area may emit light of three primary colors. For example, the organic light emitting diodes OLED may include a red organic light emitting diode that emits red light, a green organic light emitting diode that emits green light, and a blue organic light emitting diode that emits blue light. In FIG. 1, one of the three organic light emitting diodes OLED may be a red organic light emitting diode, another may be a green organic light emitting diode, and the other may be a blue organic light emitting diode.

An eighth insulating layer 300 is disposed on the common electrode 270. The eighth insulating layer 300 covers the entire display area to seal the organic light emitting diode OLED. The eighth insulating layer 300 may include an organic insulating material or an inorganic insulating material.

An encapsulation layer is disposed on the eighth insulating layer 300. The encapsulation layer includes a light blocking unit 310, color filters 410R, 410G, and 410B, and an overcoat layer 420.

The light blocking unit 310 may overlap a seventh insulating layer 350 and may include openings corresponding to the openings of the seventh insulating layer 350. The light blocking unit 310 may include an organic material including a black color pigment. As another example, the light blocking unit 310 may include a mixture of an inorganic material and an organic material including a black color pigment.

The color filters 410R, 410G, and 410B overlap the openings of the light blocking unit 310. The color filters 410R, 410G, and 410B may include color filters corresponding to colors of light emitted by the organic light emitting diode OLED. For example, the color filters 410R, 410G, and 410B may include a red color filter 410R, a green color filter 410G, and a blue color filter 410B. The red color filter 410R may overlap the red organic light emitting diode; the green color filter 410G may overlap the green organic light emitting diode; and the blue color filter 410B may overlap the blue organic light emitting diode.

The overcoat layer 420 is disposed on the color filters 410R, 410G, and 410B. The overcoat layer 420 may cover the entire display area. The overcoat layer 420 may include a transparent organic material. As another example, the overcoat layer 420 may include a mixture of a transparent inorganic material and an organic material.

A manufacturing method of a display device according to the exemplary embodiment of FIG. 1 will now be described with reference to FIG. 2 to FIG. 7.

FIG. 2 to FIG. 7 illustrate schematic cross-sectional views showing a manufacturing method of a display device according to an exemplary embodiment of the present invention.

Figure 2:
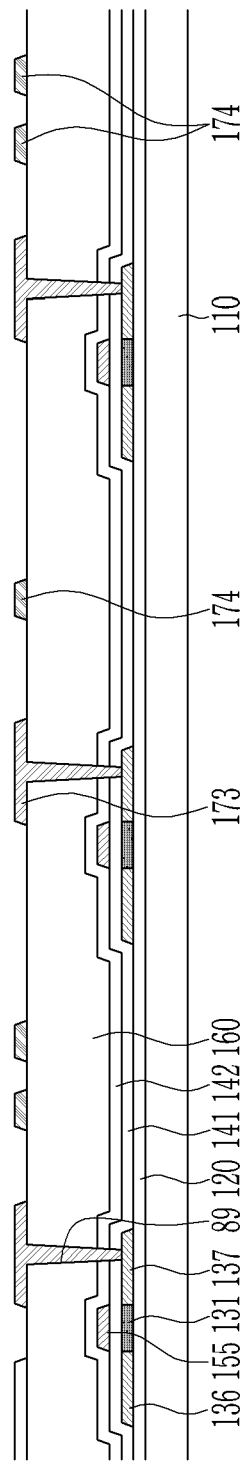
FIG. 2 to FIG. 7 illustrate schematic cross-sectional views showing a manufacturing method of a display device according to an exemplary embodiment of the present invention.

As illustrated in FIG. 2, a transistor including a channel region 131, a source region 136, a drain region 137, and a gate electrode 155 is disposed on the substrate 110. A transistor may be formed by sequentially stacking a first insulating layer 120, a semiconductor layer, a second insulating layer 141, and a gate electrode 155 on the substrate 110. A third insulating layer 142 and a fourth insulating layer 160 are sequentially stacked on the transistor; and an opening (or a contact opening) 89 is formed in the second insulating layer 141, the third insulating layer 142, and the fourth insulating layer 160. A first data conductive layer is patterned on the fourth insulating layer 160. The first data conductive layer may include a drain electrode 173 and a conductive pattern 174.

Figure 3:
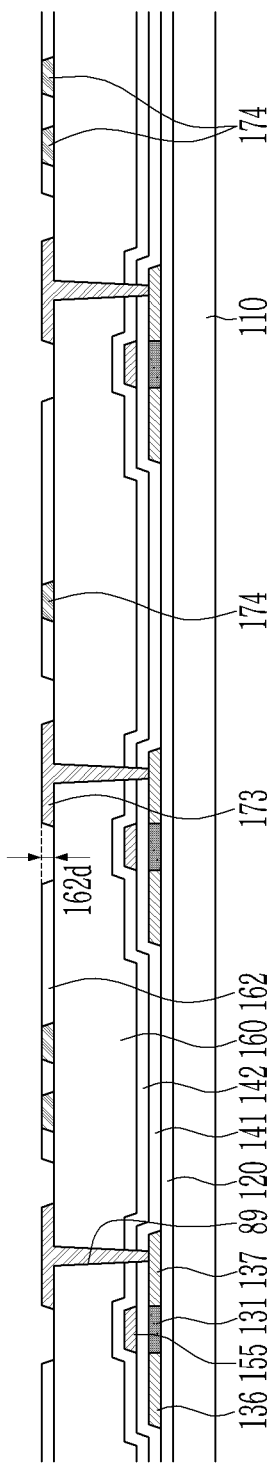

As illustrated in FIG. 3, a fifth insulating layer 162 is disposed on the fourth insulating layer 160. The fifth insulating layer 162 may not cover the first data conductive layer and may be formed to have a thickness 162d that is equal to a thickness of a portion of the first data conductive layer, disposed on the fourth insulating layer 160.

Figure 4:
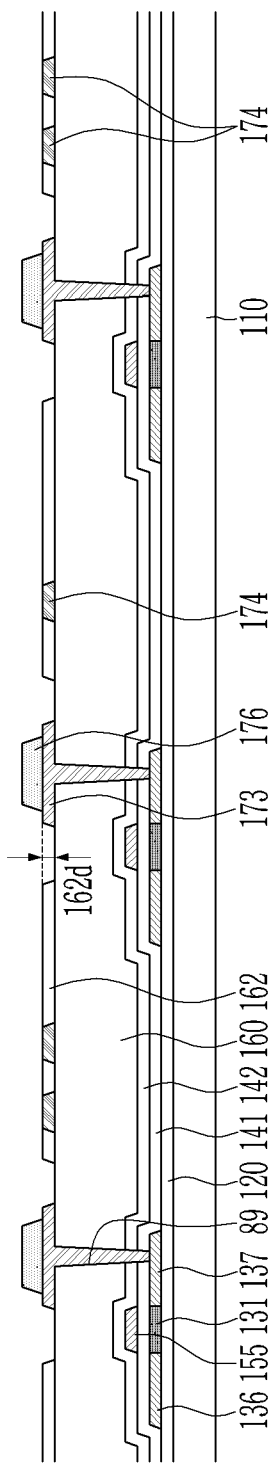

As illustrated in FIG. 4, a connection electrode 176 is disposed on the drain electrode 173. The connection electrode 176 may completely overlap the drain electrode 173. A lower surface of the connection electrode 176 may contact an upper surface of the drain electrode 173.

Figure 5:
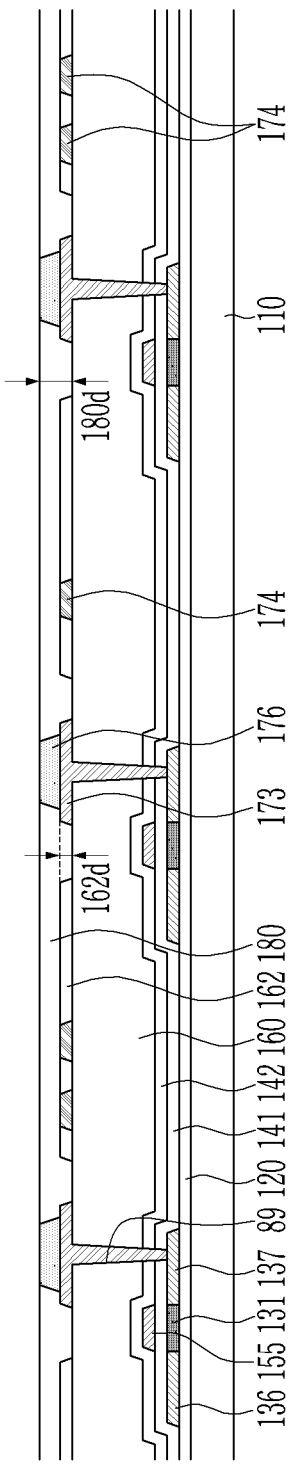

As illustrated in FIG. 5, a sixth insulating layer 180 is disposed on the first data conductive layer and the fifth insulating layer 162. The sixth insulating layer 180 may not cover the connection electrode 176, and an upper surface of the sixth insulating layer 180 and an upper surface of the connection electrode 176 may form a flat surface that is parallel to the substrate 110. A thickness 180d of the sixth insulating layer 180 may be equal to a sum of a thickness of a portion of the first data conductive layer, disposed on the fourth insulating layer 160, and a thickness of the connection electrode 176.

Figure 6:
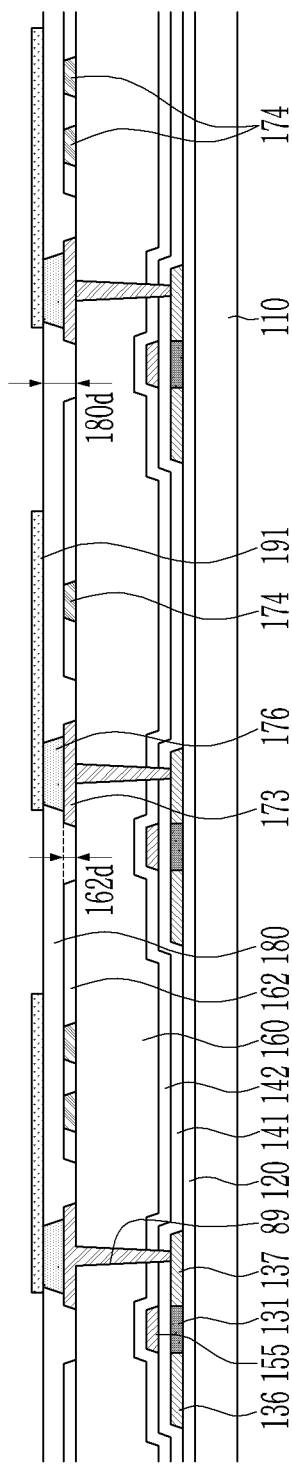

As illustrated in FIG. 6, the pixel electrode 191 is disposed on the flat surface formed by the connection electrode 176 and the sixth insulating layer 180. A lower surface of the pixel electrode 191 may contact the upper surface of the connection electrode 176, and the pixel electrode 191 may be electrically connected to the transistor through the connection electrode 176.

Figure 7:
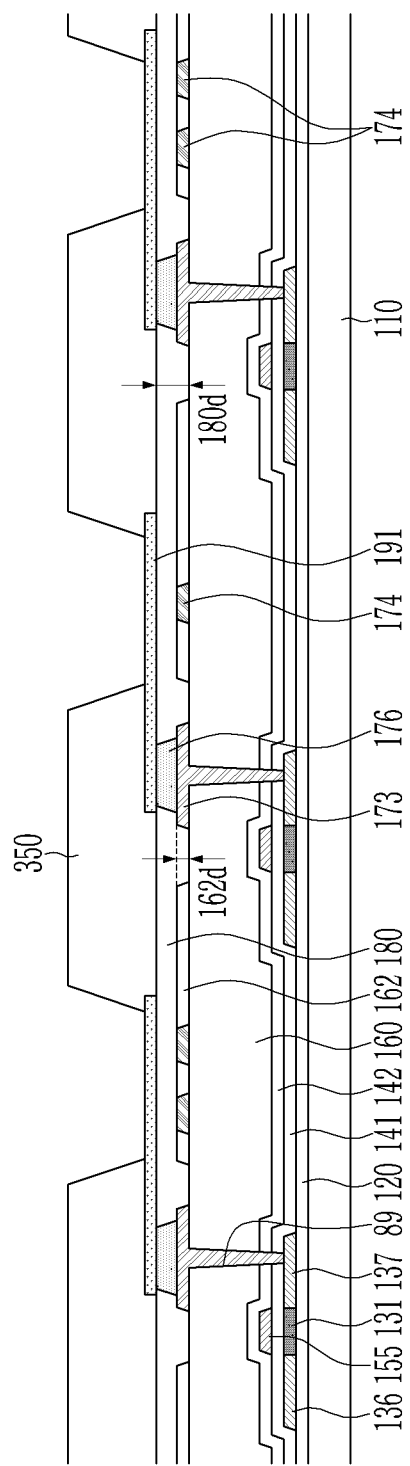

As illustrated in FIG. 7, a seventh insulating layer 350 having openings overlapping the pixel electrode 191 is formed.

Thereafter, the light emitting layer 370 and the common electrode 270 are stacked to form an organic light emitting diode OLED, and the eighth insulating layer 300, the light blocking unit 310, the color filters 410R, 410G, and 410B, and the overcoat layer 420 may be sequentially stacked on the organic light emitting diode OLED to manufacture the display device of FIG. 1.

Hereinafter, a pixel of a display device according to an exemplary embodiment will be described with reference to FIG. 8, and a driving method of the display device will be described with reference to FIG. 9.

Figure 8:
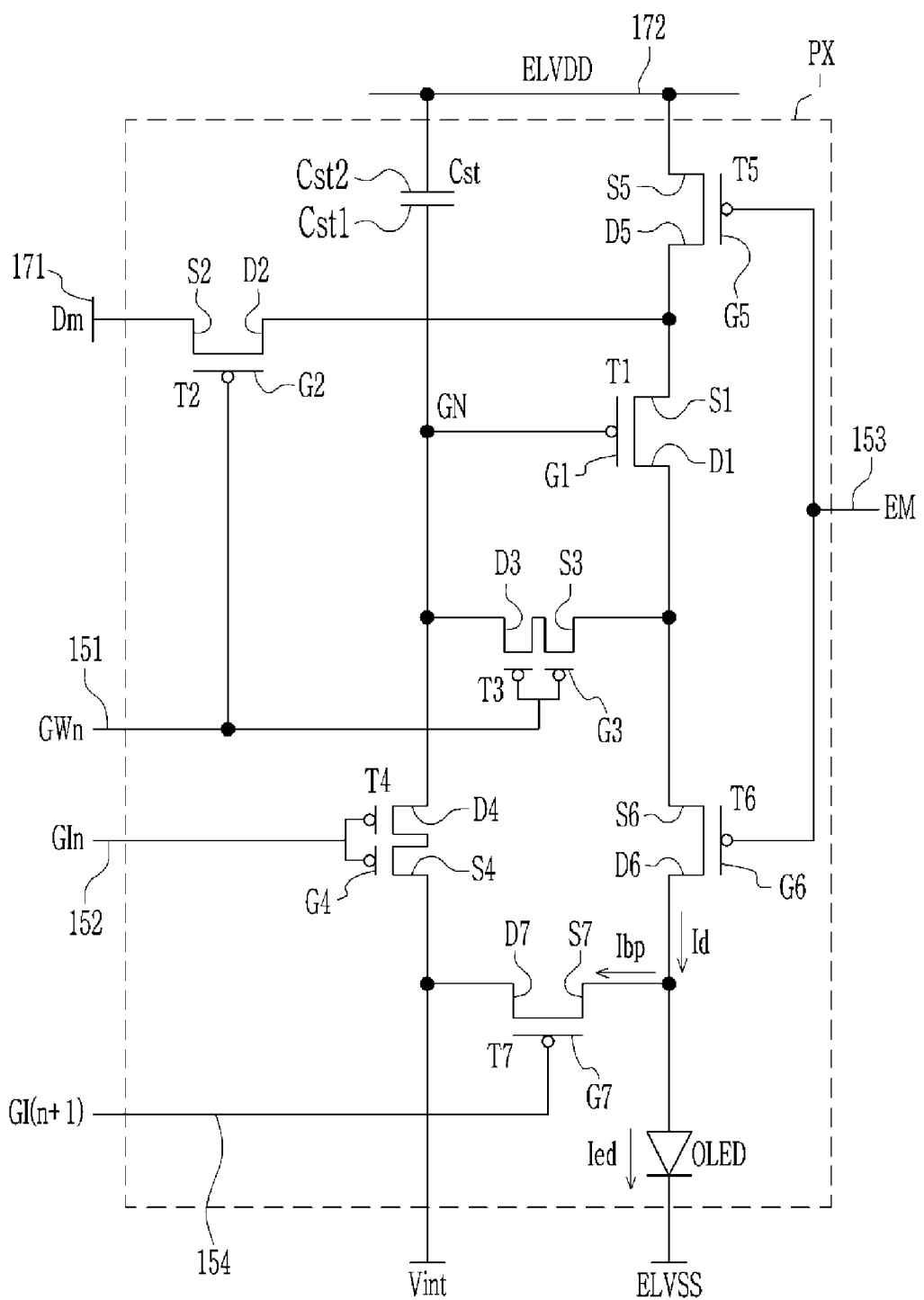
FIG. 8 illustrates a schematic equivalent circuit diagram of one pixel of a display device according to an exemplary embodiment of the present invention.

FIG. 8 illustrates a schematic equivalent circuit diagram of one pixel of a display device according to an exemplary embodiment of the present invention.

Referring to FIG. 8, the display device includes pixels PX and signal lines 151, 152, 153, 154, 171, and 172 for displaying an image depending on an image signal. One pixel PX includes transistors T1, T2, T3, T4, T5, T6, and T7 which are electrically connected to one or more elements among the signal lines 151, 152, 153, 154, 171, and 172, a capacitor Cst, and an organic light emitting diode OLED.

The signal lines 151, 152, 153, 154, 171, and 172 may include scan lines 151, 152, and 154, control lines 153, data lines 171, and driving voltage lines 172.

The scan lines 151, 152, and 154 may transfer scan signals GWn, GIn, and GI(n+1), respectively. The scan signals GWn, GIn, and GI(n+1) may be formed of a combination of a gate-on voltage and a gate-off voltage. The gate-on voltage is a voltage that turns on the transistors T2, T3, T4, and T7 included in the pixel PX, and the gate-off voltage is a voltage that turns off the transistors T2, T3, T4, and T7 included in the pixel PX.

The scan lines 151, 152, and 154 electrically connected to a pixel PX may include a first scan line 151, a second scan line 152, and a third scan line 154. The first scan line 151 transfers the first scan signal GWn. The second scan line 152 may transfer the second scan signal GIn having the gate-on voltage at a different time from the first scan line 151. The third scan line 154 may transfer a third scan signal GI(n+1).

The control lines 153 may transfer an emission control signal EM for controlling light emission of the organic light emitting diode OLED included in the pixel PX. The emission control signal EM may be formed of a combination of the gate-on voltage and the gate-off voltage.

The data line 171 transfers a data signal Dm having a voltage level corresponding to an image signal.

The driving voltage line 172 may transfer a driving voltage ELVDD. The driving voltage ELVDD may have a constant level.

The transistors T1, T2, T3, T4, T5, T6, and T7 may include a first transistor T1, a second transistor T2, a third transistor T3, a fourth transistor T4, a fifth transistor T5, a sixth transistor T6, and a seventh transistor T7.

The first scan line 151 may transfer the scan signal GWn to the second transistor T2 and the third transistor T3. The second scan line 152 may transfer the scan signal GIn to the fourth transistor T4. The third scan line 154 may transfer the scan signal GI(n+1) to the seventh transistor T7. The control lines 153 may transfer the emission control signal EM to the fifth transistor T5 and the sixth transistor T6.

A gate electrode G1 of the first transistor T1 is electrically connected to a first end Cst1 of the capacitor Cst through a driving gate node GN. A source electrode S1 of the first transistor T1 is electrically connected to the driving voltage line 172 through the fifth transistor T5. A drain electrode D1 of the first transistor T1 is electrically connected to an anode of the organic light emitting diode OLED through the sixth transistor T6. The first transistor T1 may receive a data signal Dm transferred by the data line 171 depending on a switching operation of the second transistor T2 to supply a driving current Id to the organic light emitting diode OLED.

A gate electrode G2 of the second transistor T2 is electrically connected to the first scan line 151. A source electrode S2 of the second transistor T2 is electrically connected to the data line 171. A drain electrode D2 of the second transistor T2 is electrically connected to a source electrode S1 of the first transistor T1. The second transistor T2 is turned on by the first scan signal GWn transferred through the first scan line 151 to transfer the data signal Dm transferred through the data line 171 to the source electrode S1 of the first transistor T1.

A gate electrode G3 of the third transistor T3 is electrically connected to the first scan line 151. A source electrode S3 of the third transistor T3 is electrically connected to a drain electrode D1 of the first transistor T1. A drain electrode D3 of the third transistor T3 is electrically connected to a driving gate node GN. The third transistor T3 may be turned on by the first scan signal GWn transferred through the first scan line 151 to electrically connect the gate electrode G1 and the drain electrode D1 of the first transistor T1 to each other such that the first transistor T1 can be diode-connected.

A gate electrode G4 of the fourth transistor T4 is electrically connected to the second scan line 152. A source electrode S4 of the fourth transistor T4 is electrically connected to an initialization voltage (Vint) terminal. A drain electrode D4 of the fourth transistor T4 is electrically connected to the driving gate node GN. The fourth transistor T4 is turned on by the second scan signal Gin transferred through the second scan line 152 to transfer the initialization voltage Vint to the gate electrode G1 of the first transistor T1, in order to perform an initializing operation for initializing a voltage of the gate electrode G1 of the transistor T1.

A gate electrode G5 of the fifth transistor T5 is electrically connected to the control line 153. A source electrode S5 of the fifth transistor T5 is electrically connected to the driving voltage line 172. A drain electrode D5 of the fifth transistor T5 is electrically connected to the source electrode S1 of the first transistor T1 and the drain electrode D2 of the second transistor T2.

A gate electrode G6 of the sixth transistor T6 is electrically connected to the control line 153. A source electrode S6 of the sixth transistor T6 is electrically connected to a drain electrode D1 of the first transistor T1. A drain electrode D6 of the sixth transistor T6 is electrically connected to the anode of the organic light emitting diode OLED. The fifth transistor T5 and the sixth transistor T6 are turned on by the emission control signal EM transferred through the control line 153.

A gate electrode G7 of the seventh transistor T7 is electrically connected to the third scan line 154. A source electrode S7 of the seventh transistor T7 is electrically connected to the drain electrode D6 of the sixth transistor T6 and the anode of the organic light emitting diode OLED. A drain electrode D7 of the seventh transistor T7 is electrically connected to the initialization voltage (Vint) terminal and the source electrode S4 of the fourth transistor T4.

The transistors T1, T2, T3, T4, T5, T6, and T7 may be P-type channel transistors such as a PMOS. According to an exemplary embodiment, at least one of the transistors T1, T2, T3, T4, T5, T6, and T7 may be N-type channel transistors such as an NMOS.

A first end Cst1 of the capacitor Cst is electrically connected to the gate electrode G1 of the first transistor T1, and a second end Cst2 of the capacitor Cst is electrically connected to the driving voltage line 172.

The cathode of the organic light emitting diode OLED may be electrically connected to a common voltage (ELVSS) terminal for transferring a common voltage ELVSS to receive the common voltage ELVSS.

The structure of the pixel PX is not limited to the structure illustrated in FIG. 8, and a number of transistors and the number of capacitors included in a pixel PX, and a connection relationship thereof, may be variously modified.

Figure 9:
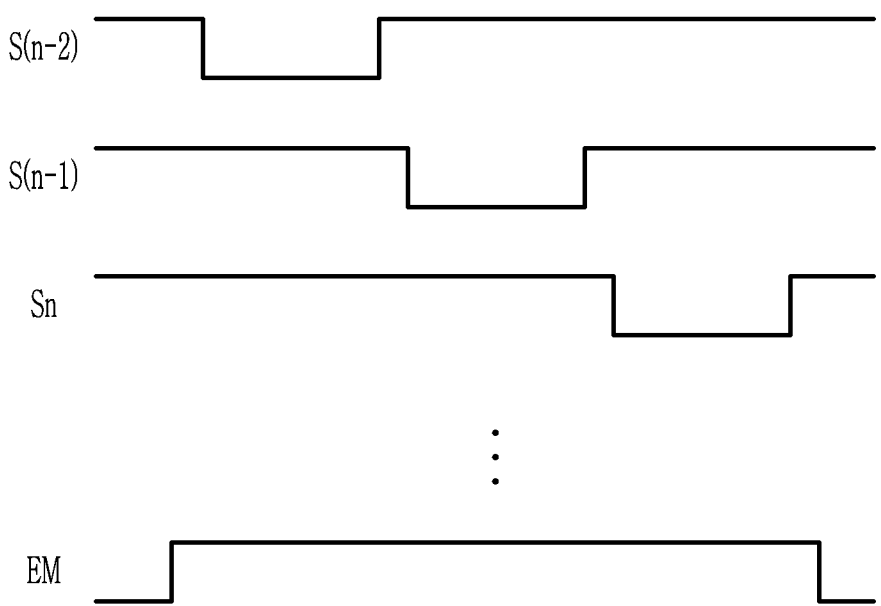
FIG. 9 illustrates a schematic driving timing diagram of a display device according to an exemplary embodiment of the present invention.

FIG. 9 illustrates a schematic driving timing diagram of a display device according to an exemplary embodiment of the present invention. A method of driving the display device including the pixel PX illustrated in FIG. 8 will now be described.

Referring to FIGS. 8 and 9, scan signals of gate-on voltages ( . . . , S(n−2), S(n−1), Sn, . . . ) may be sequentially applied to the first scan lines 151 electrically connected to the pixels PX. The gate-on voltage may be a low-level voltage, and the gate-off voltage may be a high-level voltage.

During an initialization period, the second scan signal GIn having a gate-on voltage is supplied through the second scan line 152. The second scan signal GIn may be the (n−1)th scan signal S(n−1). The fourth transistor T4 is turned on by the second scan signal GIn of the gate-on voltage. The initialization voltage Vint is applied to the gate electrode G1 of the first transistor T1 through the fourth transistor T4, and the first transistor T1 is initialized by the initialization voltage Vint.

Next, the first scan signal GWn of the gate-on voltage is supplied through the first scan line 151 during a data writing and compensation period. The first scan signal GWn may be the $n^{th}$ scan signal Sn. The second transistor T2 and the third transistor T3 are turned on by the first scan signal GWn of the gate-on voltage. In this case, the first transistor T1 is diode-connected by the turned-on third transistor T3 and is biased in a forward direction. In the data signal Dm supplied from data line 171, a compensation voltage Dm+Vth (Vth has a (−) value) that is reduced by the threshold voltage Vth of the first transistor T1 is applied to the gate electrode G1 of the first transistor T1. The gate voltage of the first transistor T1 becomes the compensation voltage Dm+Vth.

The driving voltage ELVDD and the compensation voltage Dm+Vth may be respectively applied to opposite terminals of the capacitor Cst, and the capacitor Cst may be charged with a charge corresponding to a voltage difference of the opposite terminals.

Next, the emission control signal EM supplied from the control line 153 during an emission period is changed from the gate-off voltage to the gate-on voltage. A time when the emission control signal EM is changed from the gate-off voltage to the gate-on voltage may be after the scan signals GWn are applied to all of the first scan lines 151 in one frame. During the emission period, the fifth transistor T5 and the sixth transistor T6 are turned on by the emission control signal EM of the gate-on voltage. The driving current Id corresponding to the voltage difference between the gate voltage of the first transistor T1 and the driving voltage ELVDD flows through the first transistor T1. The driving current Id is supplied to the organic light emitting diode OLED through the sixth transistor T6 so that the current led flows through the organic light emitting diode OLED.

During the initialization period, the seventh transistor T7 may receive the third scan signal G1(n+1) of the gate-on voltage through the third scan line 154. The third scan signal G1(n+1) may be the $n^{th}$ scan signal Sn. In this case, the seventh transistor T7 may be turned on simultaneously with the second and third transistors T2 and T3. Some of the driving current Id flows out through the turned-on seventh transistor T7 as the bypass current Ibp.

Hereinafter, a display device according to an exemplary embodiment will be described with reference to FIGS. 10 to 12 along with FIGS. 8 and 9 described above. Features that are different from the above-described exemplary embodiment of FIG. 1 will be mainly described.

Figure 10:
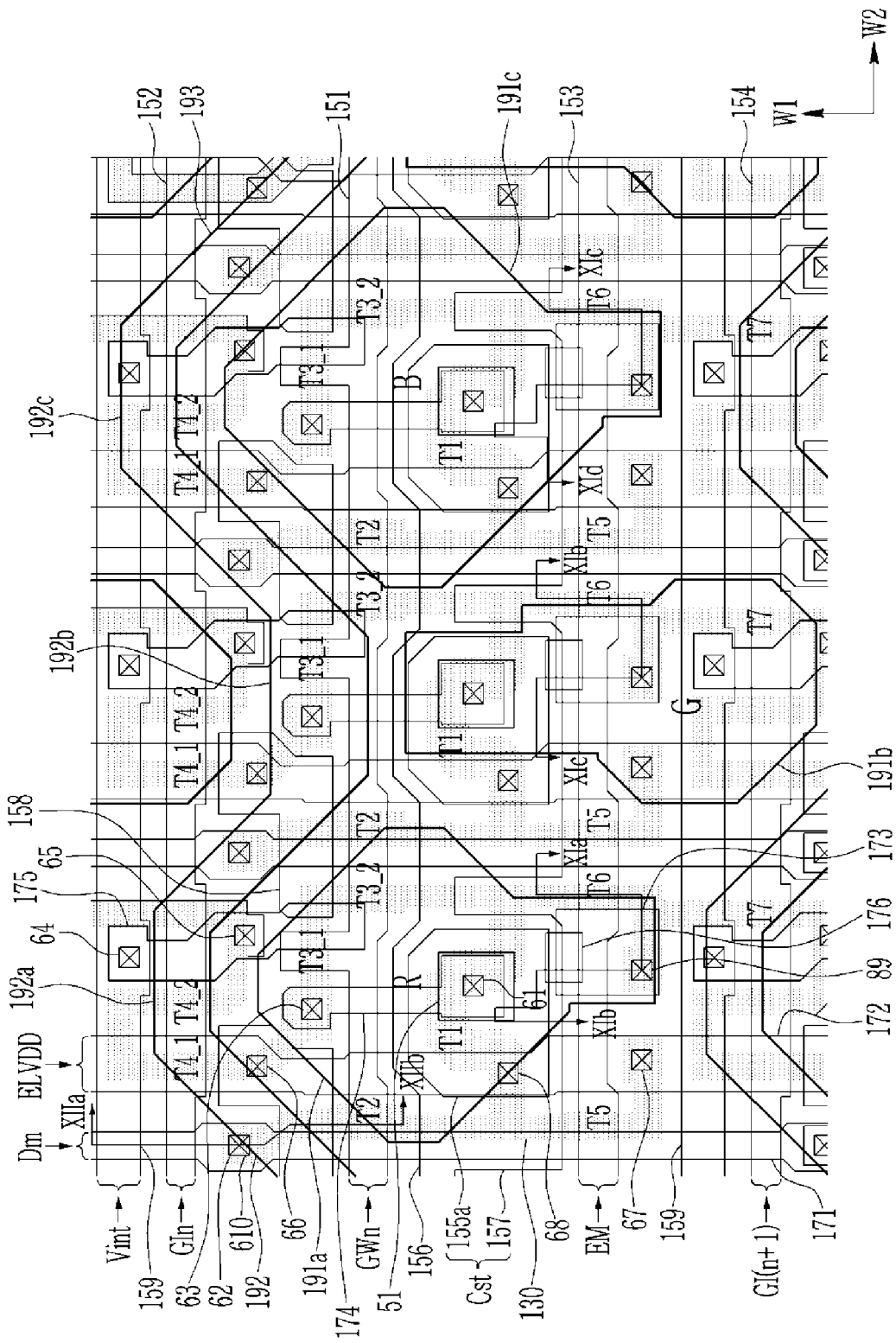
FIG. 10 illustrates a schematic plan view showing adjacent pixels of a display device according to an exemplary embodiment of the present invention

FIG. 10 illustrates a schematic plan view showing adjacent pixels of a display device according to an exemplary embodiment of the present invention.

Referring to FIG. 10, pixels PX included in the display device according to an exemplary embodiment may respectively display specific colors. The pixels PX may include a red pixel R capable of displaying red, a green pixel G capable of displaying green, and a blue pixel B capable of displaying blue. FIG. 10 illustrates a red pixel R, a green pixel G, and a blue pixel B, which are adjacent. As another example, at least one of the red pixels R, the green pixels G, and the blue pixels B may display a different color. As another example, the pixels PX may further include pixels displaying colors other than red, green, and blue.

The display device may include a gate conductive layer including a first scan line 151 for transferring a first scan signal GWn, a second scan line 152 for transferring a second scan signal GIn, a third scan line 154 for transferring a third scan signal GI(n+1), a control line 153 for transferring an emission control signal EM, and the like. The gate conductive layer may include a same material and may be disposed on a same layer on the substrate 110.

The scan lines 151, 152, and 154 and the control line 153 may extend mainly in a second direction W2 in a plan view. In a plan view, the first scan line 151 may be positioned between the second scan line 152 and the control line 153. In general, in a display device, the third scan line 154, which is a scan line substantially identical to the second scan line 152, may transfer a next scan signal GI(n+1) after the second scan signal GIn is transferred by the second scan line 152.

The display device may further include a storage conductive layer including a storage electrode line 156, an initialization voltage line 159, and the like. On a cross-section, the storage conductive layer and the gate conductive layer may be disposed on different layers. For example, the storage conductive layer may be disposed on the gate conductive layer.

The storage electrode line 156 and the initializing voltage line 159 may extend mainly in a second direction W2 in a plan view. In a plan view, the storage electrode line 156 may be positioned between the first scan line 151 and the control line 153. The storage electrode line 156 may include an extension 157 disposed at each of the pixels R, G, and B. The extension 157 may be electrically connected to the driving voltage line 172 through an opening (or a contact opening) 68 to receive a driving voltage ELVDD. A storage opening 51 is formed in the extension 157.

The initialization voltage line 159 transfers an initialization voltage Vint. In a plan view, the initialization voltage line 159 may be positioned between the third scan line 154 and the control line 153.

The display device may include a data line 171 for transferring a data signal Dm and a driving voltage line 172 for transferring the driving voltage ELVDD. The data line 171 and the driving voltage line 172, and the gate conductive layer and the storage conductive layer may be disposed on different layers. For example, the data line 171 and the driving voltage line 172 may be disposed on the storage conductive layer.

The data line 171 and the driving voltage line 172 may extend mainly in a first direction W1 in a plan view, to intersect the scan lines 151, 152, and 154, the control line 153, the storage electrode line 156, and the initialization voltage line 159.

Each of the pixels R, G, and B includes transistors T1, T2, T3, T4, T5, T6, and T7 electrically connected to the scan lines 151, 152, and 154, the control line 153, the data line 171, and the driving voltage line 172, a capacitor Cst, and an organic light emitting diode OLED.

A channel of each of the transistors T1, T2, T3, T4, T5, T6, and T7 included in each of the pixels R, G, and B may be formed inside one active pattern 130. The active pattern 130 may be bent to have various shapes. The active pattern 130 may include a semiconductor material such as polysilicon and an oxide semiconductor. The active pattern 130 corresponds to the semiconductor layer described with reference to FIG. 1. On the cross-section, the active pattern 130 may be disposed between the substrate 110 and the gate conductive layer. The active pattern 130 includes a channel region and a conductive region. The channel region forms a channel of each of the transistors T1, T2, T3, T4, T5, T6, and T7. The third transistor T3 and the fourth transistor T4 may have a dual gate structure. In this case, each of the third transistor T3 and the fourth transistor T4 may include two channel regions. The conductive region is disposed at opposite sides of the channel region to have a higher carrier concentration than that of the channel region. In the active pattern 130, most of a remaining portion except for the channel region may be a conductive region. A pair of conductive regions disposed on opposite sides of the channel region of each of the transistors T1, T2, T3, T4, T5, T6, and T7 may respectively be a source region and a drain region of the corresponding transistor T1, T2, T3, T4, T5, T6, or T7, and the source region and the drain region of the corresponding transistor T1, T2, T3, T4, T5, T6, or T7 may respectively function as a source electrode and a drain electrode of the corresponding transistor T1, T2, T3, T4, T5, T6, or T7.

The first transistor T1 includes a driving gate electrode 155a overlapping the channel region. The channel region of the first transistor T1 may be bent at least once. For example, the channel region of the first transistor T1 may have a meandering shape or a zigzag shape. The driving gate electrode 155a may be included in the gate conductive layer and may be electrically connected to the conductive pattern 174 through an opening (or a contact opening) 61 and a storage opening 51. The storage opening 51 surrounds the opening 61. The conductive pattern 174 and the data line 171 may be disposed on the same layer. The conductive pattern 174 may extend in a direction that is parallel to a direction in which the data line 171 extends. The conductive pattern 174 corresponds to the driving gate node GN together with the driving gate electrode 155a.

The second transistor T2 is disposed at a portion where the active pattern 130 and the first scan line 151 overlap. The gate electrode of the second transistor T2 (see 155b, e.g., in FIG. 12) is a portion of the first scan line 151. The source region of the second transistor T2 (see 136b, e.g., in FIG. 12) is positioned above the first scan line 151 in a plan view, and the source region of the second transistor T2 (see 136b in FIG. 12) is electrically connected to the channel region of the second transistor T2 (see 131b, e.g., in FIG. 12). The source region 136b is electrically connected to the data line 171 through openings 62 and 610. The drain region of the second transistor T2 (see 137b, e.g., in FIG. 12) is positioned below the first scan line 151 in a plan view, is electrically connected to the channel region 131b, and is electrically connected to the source region of the first transistor T1.

The third transistor T3 may be formed in two parts to prevent a leakage current. For example, the third transistor T3 may include an upper third transistor T3_1 and a lower third transistor T3_2 electrically connected to each other. A gate electrode of the upper third transistor T3_1 may be a portion of the protrusion of the first scan line 151. A gate electrode of the lower third transistor T3_2 may be a portion of the first scan line 151.

The fourth transistor T4 may also be formed in two parts to prevent a leakage current. For example, the fourth transistor T4 may include a left fourth transistor T4_1 and a right fourth transistor T4_2 electrically connected to each other. A gate electrode of the left fourth transistor T4_1 may be a portion of the second scan line 152. A drain region of the left fourth transistor T4_1 is positioned below the second scan line 152 in a plan view, is electrically connected to the drain region of the upper third transistor T3_1, and is electrically connected to the conductive pattern 174 through an opening (or a contact opening) 63. A gate electrode of the right fourth transistor T4_2 may be a portion of the second scan line 152. A drain region of the right fourth transistor T4_2 is electrically connected to the source region of the left fourth transistor T4_1, and the source region of the right fourth transistor T4_2 is electrically connected to the connection member 175 through an opening (or a contact opening) 65.

The connection member 175 and the data line 171 may be disposed on the same layer. It may be included in the conductive layer. The connection member 175 may be electrically connected to the initialization voltage line 159 through an opening (or a contact opening) 64.

A gate electrode of the fifth transistor T5 may be a portion of the control line 153. A source region of the fifth transistor T5 is positioned below the control line 153 in a plan view, is electrically connected to the channel region, and is electrically connected to the driving voltage line 172 through an opening (or a contact opening) 67. A drain region of the fifth transistor T5 is positioned above the control line 153 in a plan view, is electrically connected to the channel region, and is electrically connected to the source region of the first transistor T1.

A gate electrode of the sixth transistor T6 may be a portion of the control line 153. A source region of the sixth transistor T6 is positioned above the control line 153 in a plan view, is electrically connected to the channel region, and is electrically connected to the drain region of the first transistor T1. A drain region of the sixth transistor T6 is positioned below the control line 153 in a plan view, is electrically connected to the channel region, and is electrically connected to the drain electrode 173 through an opening (or a contact opening) 89.

A gate electrode of the seventh transistor T7 may be a portion of the third scan line 154. A source region of the seventh transistor T7 is positioned above the third scan line 154 in a plan view, is electrically connected to the channel region, and is electrically connected to the drain region of the sixth transistor T6. A drain region of the seventh transistor T7 may be positioned below the third scan line 154 in a plan view and electrically connected to the connection member 175 through the opening 65 to receive the initialization voltage Vint.

The capacitor Cst may include the driving gate electrode 155a and the extension 157 of the storage electrode line 156 overlapping each other as two terminals in a plan view. The capacitor Cst may maintain a voltage difference between the extension 157 of the storage electrode line 156 to which the driving voltage ELVDD is applied, and the driving gate electrode 155a. The extension 157 of the storage electrode line 156 may have a larger area than the driving gate electrode 155a in a plan view and may cover an entire area of the driving gate electrode 155a.

The display device may further include a shielding pattern (see 158 of FIG. 12) overlapping the data line 171. The shielding pattern 158 may be a conductor that is electrically connected to the driving voltage line 172 through an opening (or a contact opening) 66 to receive the driving voltage ELVDD. The shielding pattern 158 may shield between the driving gate node GN and the data line 171 to prevent a voltage change of the driving gate node GN caused by a change of the data signal Dm. According to an exemplary embodiment, the shielding pattern 158 may be omitted.

The display device may further include a pixel conductive layer including pixel electrodes 191a, 191b, and 191c and a pixel conductive pattern 192.

The pixel electrodes 191a, 191b, and 191c may be arranged to have a pentile matrix structure. For example, the pixel electrode 191a of the red pixel R and the pixel electrode 191c of the blue pixel B may be alternately arranged in a horizontal direction. The pixel electrode 191a of the red pixel R and the pixel electrode 191b of the green pixel G may be alternately arranged in one diagonal direction. The pixel electrode 191c of the blue pixel B and the pixel electrode 191b of the green pixel G may be alternately arranged in another diagonal direction. The disposal structure of the pixel electrodes 191a, 191b, and 191c is not limited thereto and may be variously changed.

Each of the pixel electrodes 191a, 191b, and 191c may be electrically connected to the sixth transistor T6 through the connection electrode 176 overlapping the drain electrode 173.

The pixel conductive pattern 192 may be curved along edges of the pixel electrodes 191a, 191b, and 191c, which are adjacent. The pixel conductive pattern 192 may include straight portions 192a, 192b, and 192c that are alternately arranged, and a diagonal portion 193. The straight-line portions 192a, 192b, and 192c may be generally extended parallel to the scan lines 151, 152, and 154. The diagonal portion 193 may extend obliquely with respect to extension directions of the straight-line portions 192a, 192b, and 192c. The pixel conductive pattern 192 may transfer the initialization voltage Vint.

Figure 11:
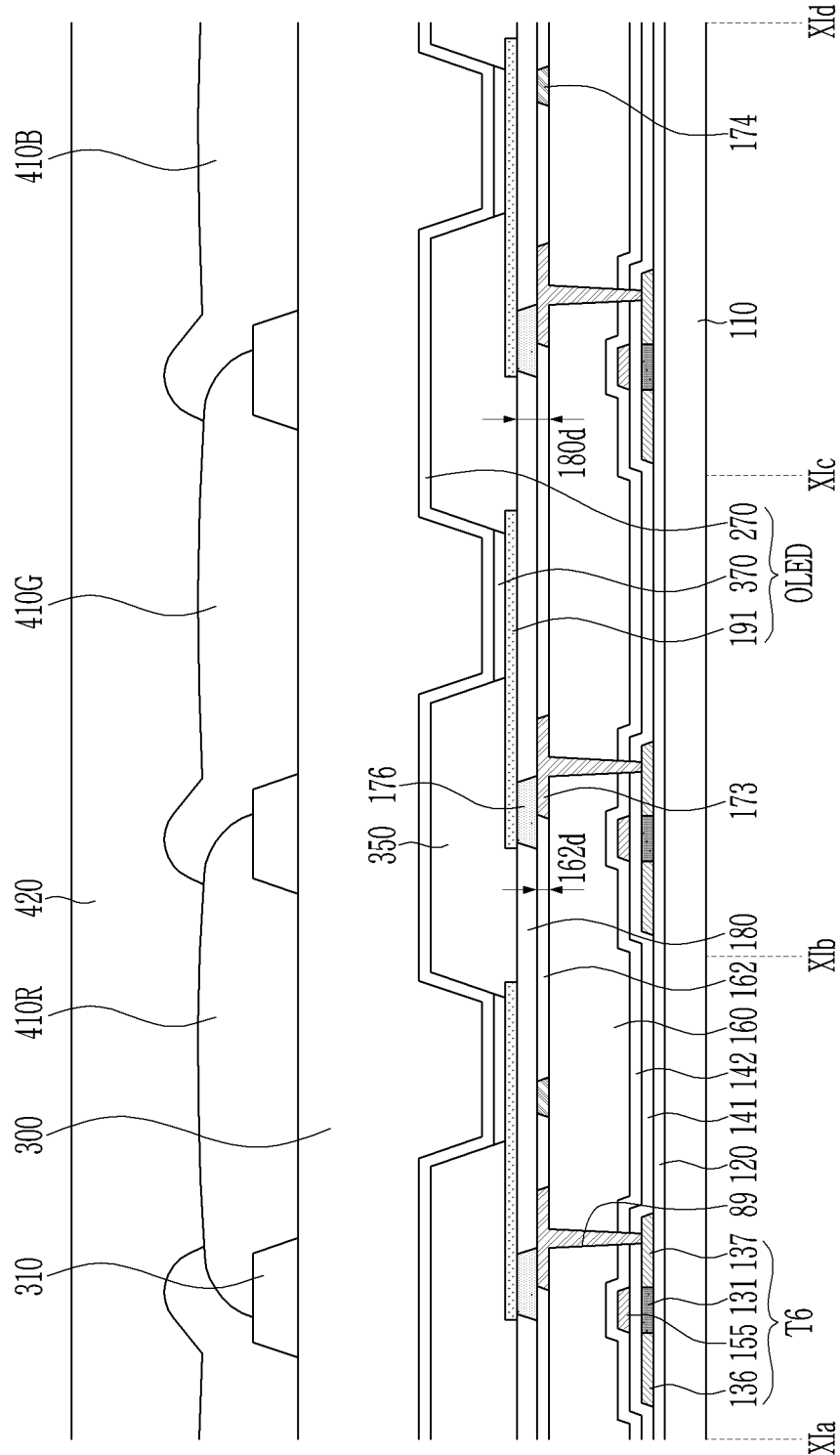
FIG. 11 is a schematic cross-sectional view illustrating a cross-section of the display device along lines XIa-XIb, XIb-XIc, and XIc-XId of FIG. 10.

FIG. 11 is a schematic cross-sectional view illustrating a cross-section of the display device along lines XIa-XIb, XIb-XIc, and XIc-XId of FIG. 10. FIG. 12 illustrates a schematic cross-sectional view showing a cross-section of the display device along a line XIIa-XIIb in FIG. 10. FIG. 11 illustrates a schematic cross-section of a portion overlapping the pixel electrode 191, and FIG. 12 illustrates a schematic cross-section of a portion that does not overlap the pixel electrode 191. In FIG. 12, the eighth insulating layer 300 and the encapsulation layer disposed on the common electrode 270 are omitted.

Figure 12:
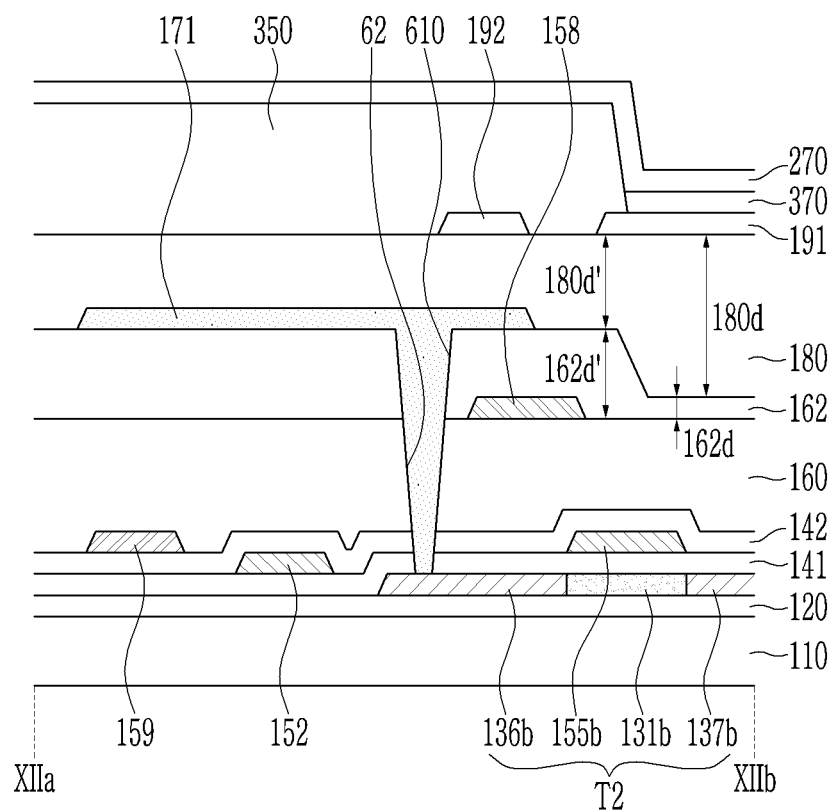
FIG. 12 illustrates a schematic cross-sectional view showing a cross-section of the display device along a line XIIa-XIIb in FIG. 10.

Referring to FIG. 11 and FIG. 12, the fifth insulating layer 162 may be formed not to cover the drain electrode 173 and the conductive pattern 174 overlapping the pixel electrode 191, and to cover the first data conductive layer at a portion that does not overlap the pixel electrode 191. The fifth insulating layer 162 may contact a side surface of the drain electrode 173 and a side surface of the conductive pattern 174. A first thickness 162d of a first portion of the fifth insulating layer 162 in a portion overlapping the pixel electrode 191 may be equal to that of a portion of the drain electrode 173, disposed on the fourth insulating layer 160. A second thickness 162d' of a second portion of the fifth insulating layer 162 in the portion not overlapping the pixel electrode 191 may be greater than the first thickness 162d. In other words, the second portion of the fifth insulating layer 162 may have the second thickness 162d' that is greater than the first thickness 162d in the portion overlapping the data line 171.

For example, the first data conductive layer may include a shielding pattern 158 disposed on the fourth insulating layer 160. The shielding pattern 158 may be positioned in the portion not overlapping the pixel electrode 191. In this case, the second portion of the fifth insulating layer 162 may be formed to have the second thickness 162d' so as to cover the shielding pattern 158. The fifth insulating layer 162 may include an opening (or a contact opening) 610 overlapping the opening 62.

A second data conductive layer is disposed on the first data conductive layer and the fifth insulating layer 162. The second data conductive layer may include the data line 171 and the connection electrode 176. The data line 171 may be positioned in a portion that does not overlap the pixel electrode 191 and may electrically contact the source region 136b of the second transistor T2 through the openings 62 and 610. The connection electrode 176 may partially overlap the drain electrode 173. A portion of a lower surface of the connection electrode 176 may electrically contact a portion of an upper surface of the drain electrode 173.

The sixth insulating layer 180 may not cover the second data conductive layer in a portion overlapping the pixel electrode 191 and may cover the second data conductive layer in a portion not overlapping the pixel electrode 191. For example, the sixth insulating layer 180 may cover the data line 171 without covering the connection electrode 176. A first thickness 180d of a first portion of the sixth insulating layer 180 in the portion overlapping the pixel electrode 191 may be equal to the thickness of the connection electrode 176, and an upper surface of the sixth insulating layer 180 and the upper surface of the connection electrode 176 may form one flat surface that is parallel to the substrate 110. The second thickness 180d' of a second portion of the sixth insulating layer 180 may be smaller than the first thickness 180d in the portion that does not overlap the pixel electrode 191, and thus the upper surface of the sixth insulating layer 180 may be flatly formed in the entire display area.

A pixel conductive layer including the pixel electrode 191 and the pixel conductive pattern 192 may be disposed on the sixth insulating layer 180.

Except for these differences, the features of the exemplary embodiment described with reference to FIG. 1 may be applied to the exemplary embodiment described with reference to FIGS. 10 to 12, and duplicate description of the features of the exemplary embodiment described with reference to FIG. 1 will be omitted.

A manufacturing method of a display device according to the exemplary embodiment of FIG. 11 and FIG. 12 will now be described with reference to FIG. 13 to FIG. 24.

FIG. 13 to FIG. 24 illustrate schematic cross-sectional views showing a manufacturing method of a display device according to an exemplary embodiment of the present invention.

Figure 13:
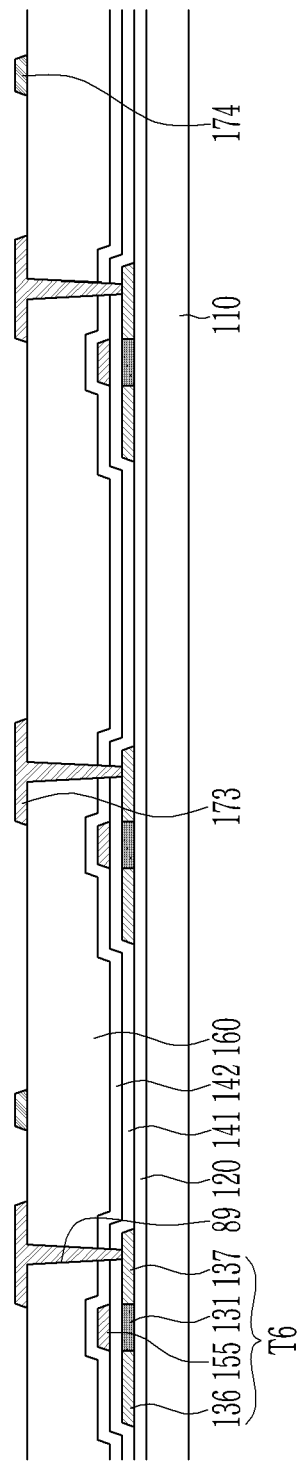
FIG. 13 to FIG. 24 illustrate schematic cross-sectional views showing a manufacturing method of a display device according to an exemplary embodiment of the present invention.
Figure 14:
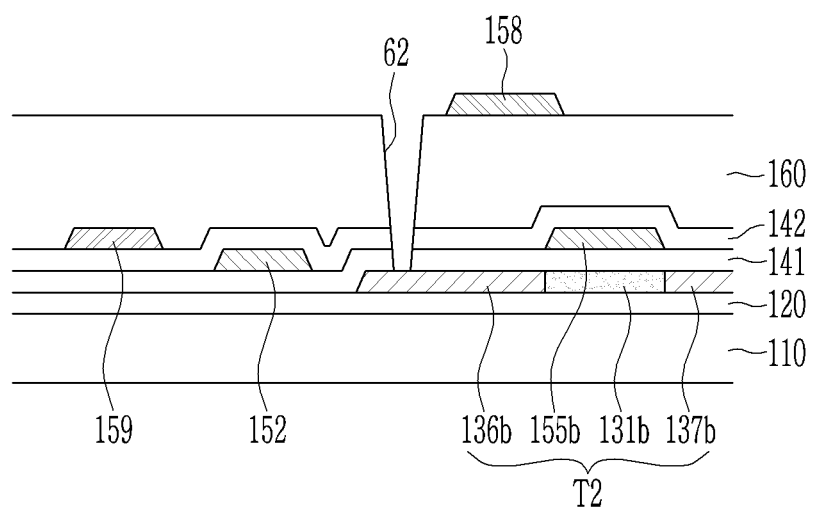

As illustrated in FIG. 13 and FIG. 14, a transistor including a channel region 131, a source region 136, a drain region 137, and a gate electrode 155 is disposed on the substrate 110. A transistor (e.g., T2 and T6) may be formed by sequentially stacking a first insulating layer 120, a semiconductor layer, a second insulating layer 141, and a gate electrode 155 on the substrate 110. The second scan line 152 and the gate electrode may be formed by a same process 155 and may include a same material. A third insulating layer 142 may be stacked on a transistor, and a storage conductive layer including an initialization voltage line 159 may be disposed on the third insulating layer 142. A fourth insulating layer 160 is disposed on the storage conductive layer. An opening (or a contact opening) 89 is formed in the second insulating layer 141, the third insulating layer 142, and the fourth insulating layer 160. A first data conductive layer is patterned on the fourth insulating layer 160. The first data conductive layer may include a drain electrode 173, a conductive pattern 174, and a shielding pattern 158.

Figure 15:
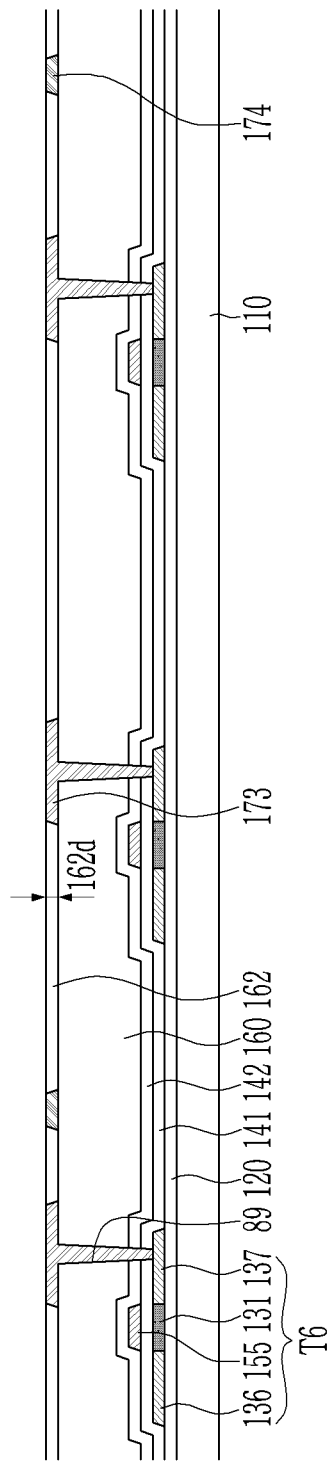
Figure 16:
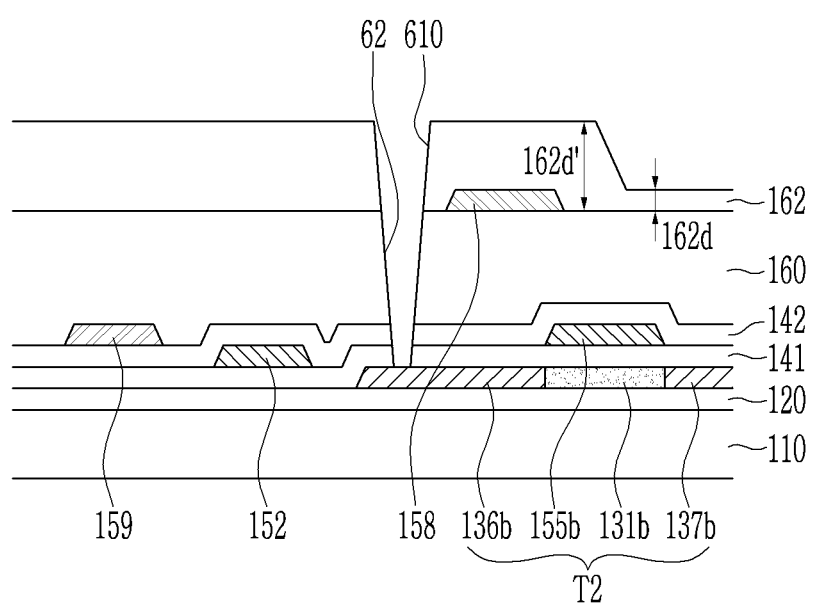

As illustrated in FIG. 15 and FIG. 16, a fifth insulating layer 162 is disposed on the fourth insulating layer 160. The fifth insulating layer 162 may be formed not to cover the drain electrode 173 and the conductive pattern 174 overlapping the pixel electrode 191, and to cover the first data conductive layer at a portion that does not overlap the pixel electrode 191. A first thickness 162d of a first portion of the fifth insulating layer 162 in a portion overlapping the pixel electrode 191 may be equal to that of a portion of the drain electrode 173, disposed on the fourth insulating layer 160. A second thickness 162d' of a second portion of the fifth insulating layer 162 in the portion not overlapping the pixel electrode 191 may be greater than the first thickness 162d. For example, the second portion of the fifth insulating layer 162 may be formed to have the second thickness 162d' so as to cover the shielding pattern 158. The fifth insulating layer 162 may be differentially formed to have a first thickness 162d and a second thickness 162d' by using a halftone mask.

Figure 17:
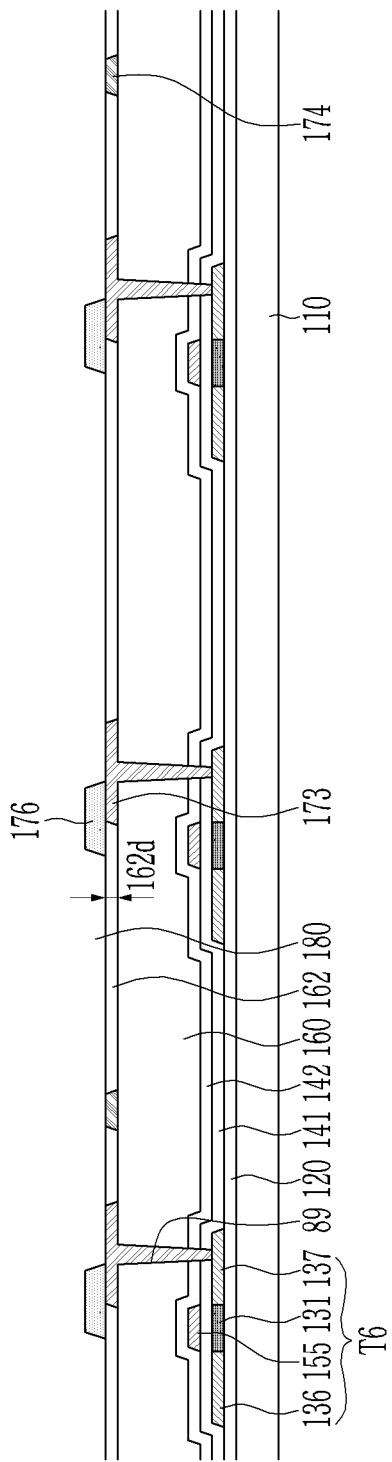
Figure 18:
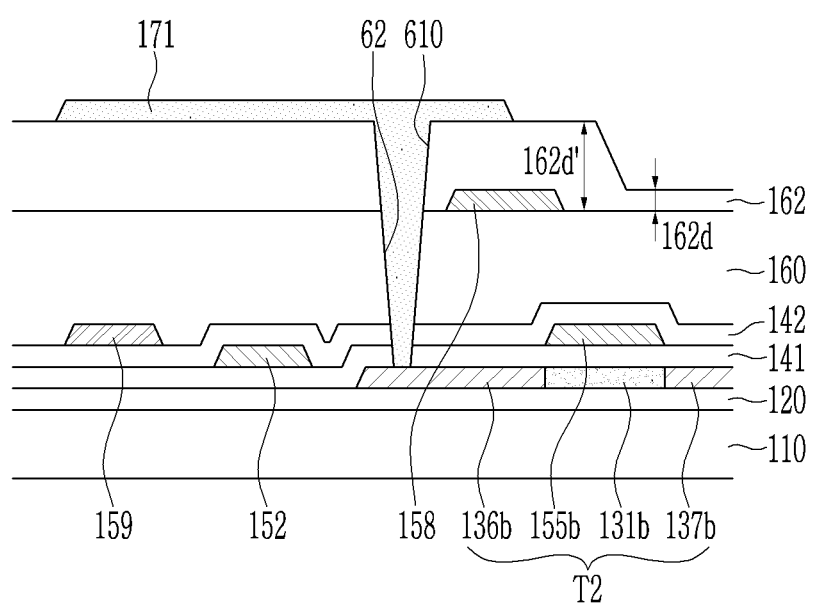

As illustrated in FIGS. 17 and 18, a second data conductive layer is disposed on the first data conductive layer and the fifth insulating layer 162. The second data conductive layer includes the data line 171 and the connection electrode 176. The data line 171 may be positioned in a portion that does not overlap the pixel electrode 191 and may electrically contact the source region 136b of the second transistor T2 through the openings 62 and 610. The connection electrode 176 may partially overlap the drain electrode 176. A portion of a lower surface of the connection electrode 176 may contact a portion of an upper surface of the drain electrode 173.

Figure 19:
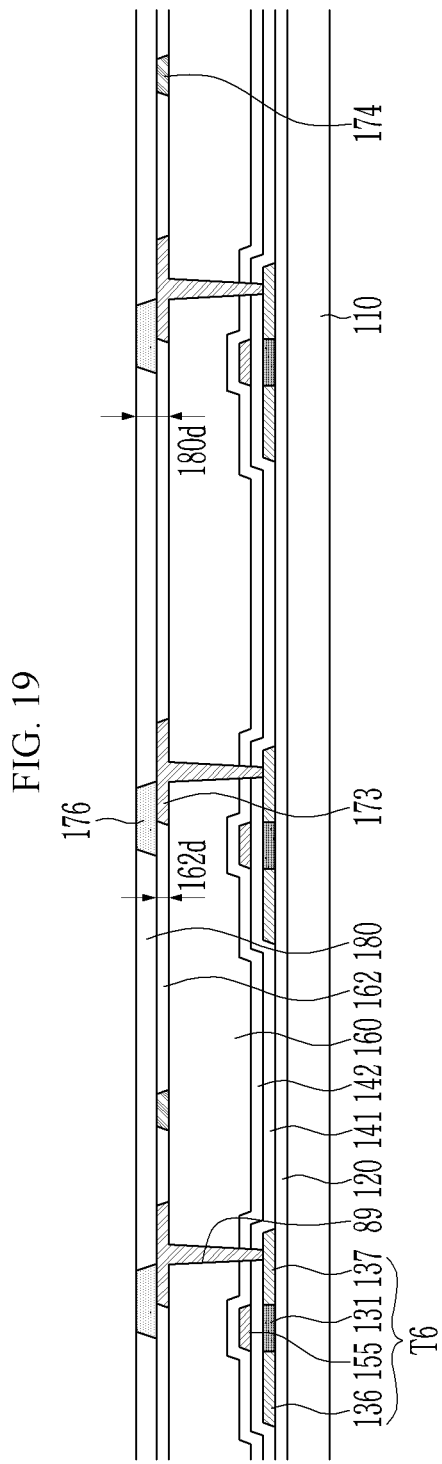
Figure 20:
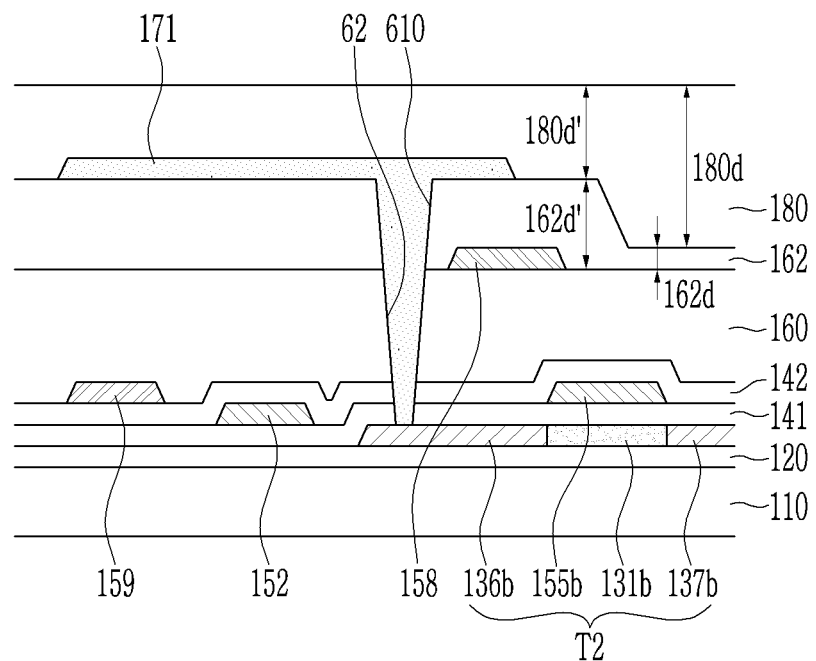

As illustrated in FIGS. 19 and 20, a sixth insulating layer 180 is disposed on the first data conductive layer and the fifth insulating layer 162. The sixth insulating layer 180 may cover the data line 171 without covering the connection electrode 176. A first thickness 180d of a first portion of the sixth insulating layer 180 in the portion overlapping the pixel electrode 191 may be equal to the thickness of the connecting electrode 176, and an upper surface of the sixth insulating layer 180 and the upper surface of the connection electrode 176 may form a flat surface that is parallel to the substrate 110. The second thickness 180d' of a second portion of the sixth insulating layer 180 may be smaller than the first thickness 180d in the portion that does not overlap the pixel electrode 191, and thus the upper surface of the sixth insulating layer 180 may be flatly formed in the entire display area.

Figure 21:
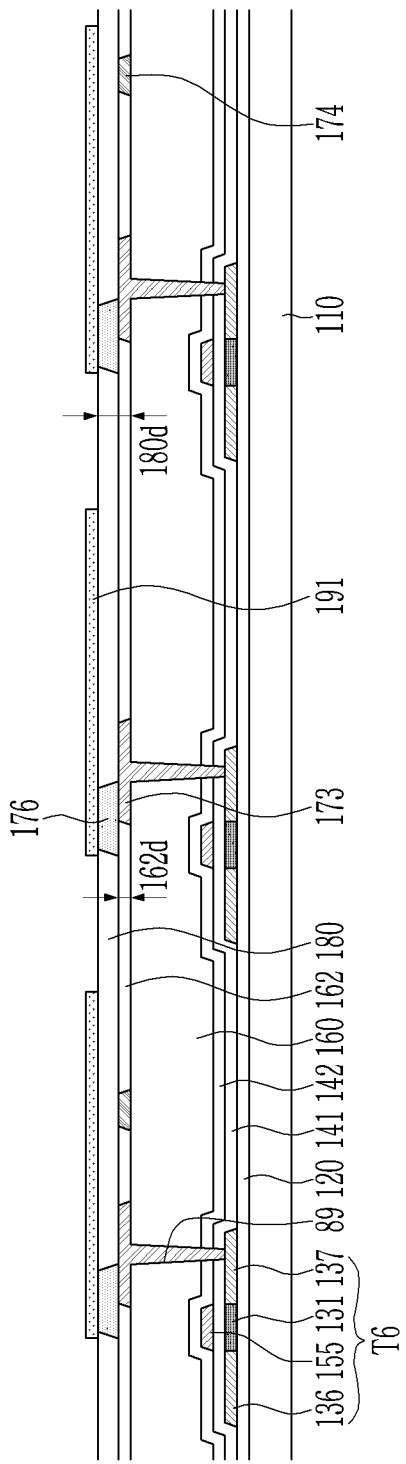
Figure 22:
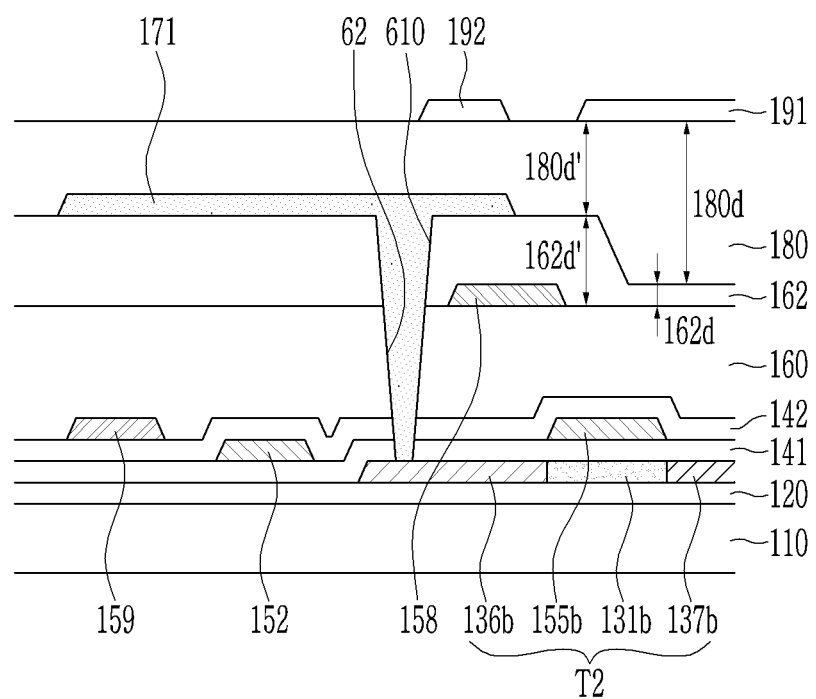

As illustrated in FIG. 21 and FIG. 22, a pixel conductive layer including the pixel electrode 191 and the pixel conductive pattern 192 may be disposed on the sixth insulating layer 180. The pixel electrode 191 is disposed on the flat surface formed by the connection electrode 176 and the sixth insulating layer 180. A lower surface of the pixel electrode 191 may contact the upper surface of the connection electrode 176, and the pixel electrode 191 may be electrically connected to the transistor T6 through the connection electrode 176.

Figure 23:
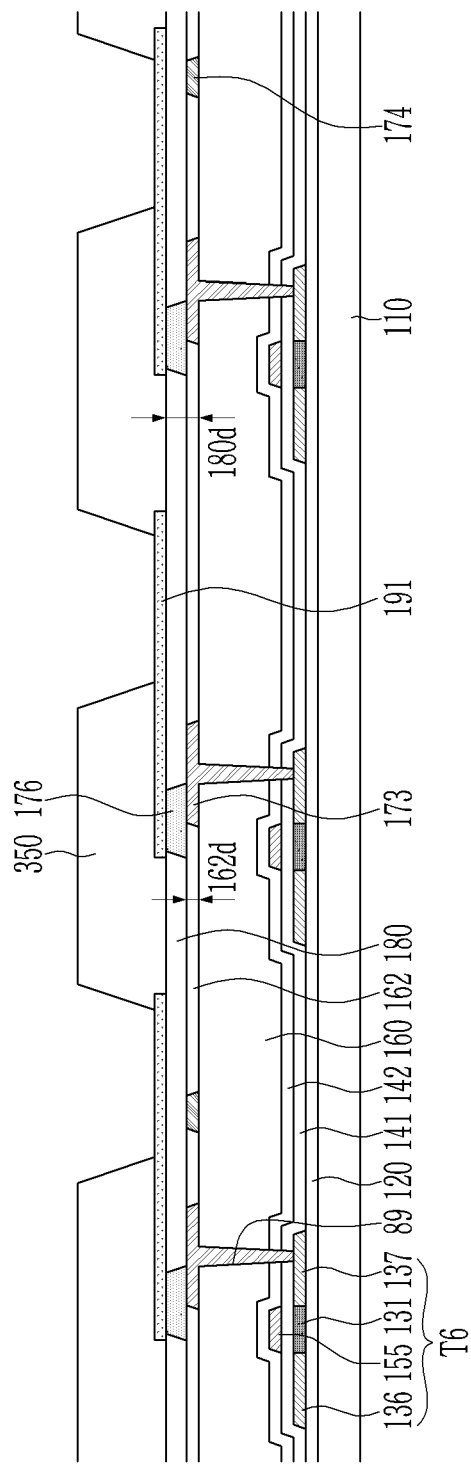
Figure 24:
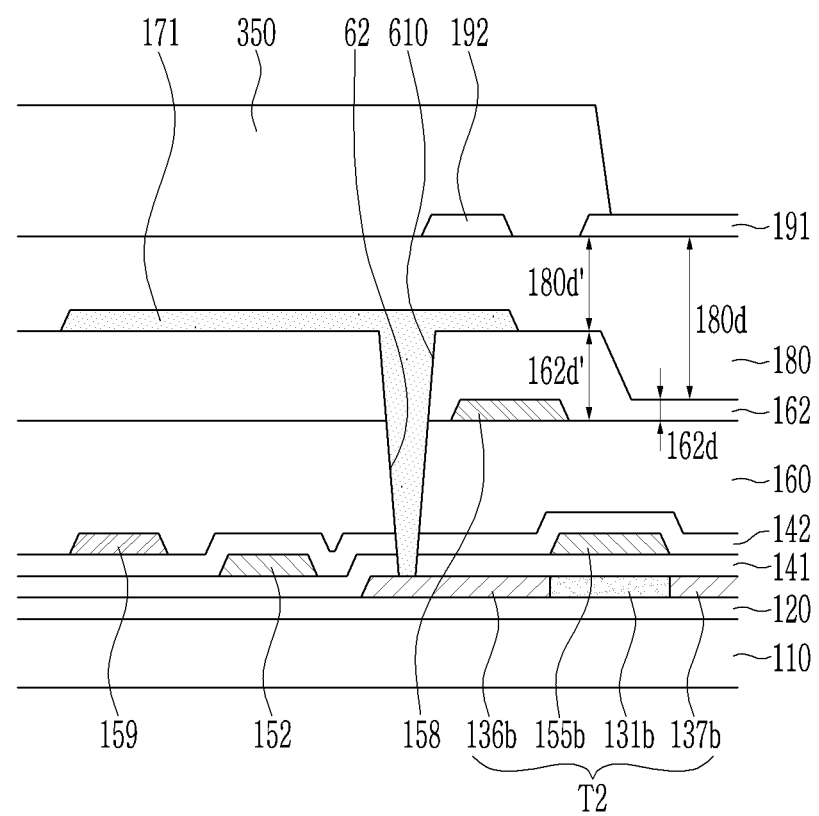

As illustrated in FIGS. 23 and 24, a seventh insulating layer 350 having openings overlapping the pixel electrode 191 is formed.

Thereafter, the light emitting layer 370 and the common electrode 270 are stacked to form an organic light emitting diode OLED, and the eighth insulating layer 300, the light blocking unit 310, the color filters 410R, 410G, and 410B, and the overcoat layer 420 may be sequentially stacked on the organic light emitting diode OLED to manufacture the display device of FIG. 11 and FIG. 12.

While exemplary embodiments of the present invention have been particularly shown and described with reference to the accompanying drawings, the specific terms used herein are only for the purpose of describing the invention and are not intended to define the meanings thereof or limit the scope of the invention set forth in the claims. Therefore, those skilled in the art will understand that various modifications and other equivalent embodiments of the present invention are possible without departing from the teachings of the present invention. Consequently, the true technical protective scope of the present invention must be determined based on the technical spirit of the appended claims.

What is claimed is:
1. A display device comprising:
a transistor disposed on a substrate and including a gate electrode, a channel region, a source region, and a drain region;
a first insulating layer disposed on the transistor;
a drain electrode that electrically contacts the drain region through an opening formed in the first insulating layer;
a connection electrode disposed on the drain electrode and electrically contacting the drain electrode;
a second insulating layer disposed on the first insulating layer, an upper surface of the second insulating layer and an upper surface of the connection electrode forming a flat surface that is parallel to the substrate;
a pixel electrode disposed on the flat surface and electrically contacting an upper surface of the connection electrode;
an emission layer disposed on the pixel electrode; and
a common electrode disposed on the emission layer.

2. The display device of claim 1, wherein the pixel electrode has a plate shape that is parallel to the substrate.

3. The display device of claim 1, wherein the pixel electrode has a plate shape that does not include a protrusion that is not parallel to the substrate.

4. The display device of claim 1, wherein the upper surface of the second insulating layer horizontally coincides with the upper surface of the connection electrode.

5. The display device of claim 1, wherein a thickness of the second insulating layer is equal to a sum of a thickness of a portion of the drain electrode, disposed on the first insulating layer, and a thickness of the connection electrode.

6. The display device of claim 5, further comprising:
a conductive pattern disposed between the first insulating layer and the second insulating layer; and
a third insulating layer disposed between the first insulating layer and the second insulating layer, and contacting a side surface of the conductive pattern without covering the conductive pattern.

7. The display device of claim 6, wherein the third insulating layer is spaced apart from the drain electrode in a horizontal direction.

8. The display device of claim 6, wherein a thickness of the third insulating layer is equal to a thickness of the conductive pattern.

9. The display device of claim 1, wherein
the second insulating layer comprises a first portion having a first thickness and a second portion having a second thickness, and
the first thickness of the first portion of the second insulating layer is equal to the thickness of the connection electrode.

10. The display device of claim 9, further comprising:
a third insulating layer disposed between the first insulating layer and the second insulating layer, and contacting a side surface of the drain electrode without covering the drain electrode.

11. The display device of claim 10, wherein the third insulating layer comprises a first portion having a first thickness and a second portion having a second thickness, and
the first thickness of the first portion of the third insulating layer is equal to a thickness of a portion of the drain electrode, disposed on the first insulating layer.

12. The display device of claim 11, further comprising:
a data line disposed between the second insulating layer and the third insulating layer and transferring a data signal; and
a conductor disposed between the first insulating layer and the third insulating layer and overlapping the data line,
wherein the second thickness of the second portion of the third insulating layer in a portion overlapping the data line is greater than the first thickness of the third insulating layer.

13. The display device of claim 12, wherein
the second thickness of the second portion of the second insulating layer in a portion overlapping the data line is smaller than the first thickness of the first portion of the second insulating layer.

14. A manufacturing method of a display device, comprising:
forming a transistor including a gate electrode, a channel region, a source region, and a drain region on a substrate;
forming a first insulating layer including an opening on the transistor;
forming a drain electrode on the first insulating layer to electrically contact the drain region through the opening;
forming a connection electrode on the drain electrode to electrically contact the drain electrode;
forming a second insulating layer on the first insulating layer;
forming an upper surface of the second insulating layer and an upper surface of the connection electrode to form a flat surface that is parallel to the substrate;
forming a pixel electrode on the flat surface to electrically contact an upper surface of the connection electrode;
forming an emission layer on the pixel electrode; and
forming a common electrode on the emission layer.

15. The manufacturing method of claim 14, wherein the forming of the pixel electrode comprises:
forming the pixel electrode to have a plate shape that is parallel to the substrate and that does not include a protrusion that is not parallel to the substrate.

16. The manufacturing method of claim 14, wherein the forming of the upper surface of the second insulating layer and the upper surface of the connection electrode comprises:
forming the upper surface of the second insulating layer and the upper surface of the connection electrode to horizontally coincide with each other.

17. The manufacturing method of claim 14, wherein a thickness of the second insulating layer is equal to a sum of a thickness of a portion of the drain electrode, disposed on the first insulating layer, and a thickness of the connection electrode.

18. The manufacturing method of claim 15, further comprising:
forming a conductive pattern on the first insulating layer; and
forming a third insulating layer on the first insulating layer to contact a side surface of the conductive pattern and not to cover the conductive pattern; and
forming the third insulating layer to have a thickness equal to a thickness of the conductive pattern.

19. The manufacturing method of claim 14, wherein the forming of the second insulating layer comprises:
forming the second insulating layer to include a first portion having a first thickness and a second portion having a second thickness,
wherein the first thickness of the second insulating layer is equal to a thickness of the connection electrode.

20. The manufacturing method of claim 19, further comprising
forming a third insulating layer on the first insulating layer to contact a side surface of the drain electrode and not to cover the drain electrode; and
forming the third insulating layer to include a first portion having a first thickness and a second portion having a second thickness,
wherein the first thickness of the first portion of the third insulating layer is equal to a thickness of a portion of the drain electrode, disposed on the first insulating layer.

* * * * *